US011776856B2

(12) United States Patent
Hall et al.

(10) Patent No.: US 11,776,856 B2
(45) Date of Patent: Oct. 3, 2023

(54) NANOSHEET TRANSISTORS WITH DIFFERENT GATE MATERIALS IN SAME STACK AND METHOD OF MAKING

(71) Applicant: NXP B.V., Eindhoven (NL)

(72) Inventors: Mark Douglas Hall, Austin, TX (US); Tushar Praful Merchant, Austin, TX (US); Anirban Roy, Austin, TX (US)

(73) Assignee: NXP B.V., Eindhoven (NL)

( * ) Notice: Subject to any disclaimer, the term of this patent is extended or adjusted under 35 U.S.C. 154(b) by 265 days.

(21) Appl. No.: 17/212,311

(22) Filed: Mar. 25, 2021

(65) Prior Publication Data

US 2022/0310456 A1    Sep. 29, 2022

(51) Int. Cl.
*H01L 21/8238* (2006.01)
*H01L 27/092* (2006.01)
*H01L 29/423* (2006.01)
*H01L 29/06* (2006.01)

(52) U.S. Cl.
CPC ........ *H01L 21/823807* (2013.01); *H01L 21/823842* (2013.01); *H01L 21/823857* (2013.01); *H01L 27/0922* (2013.01); *H01L 29/0665* (2013.01); *H01L 29/42392* (2013.01)

(58) Field of Classification Search
CPC ..... H01L 21/823807; H01L 21/823842; H01L 21/823857; H01L 27/0922; H01L 29/0665; H01L 29/42392; H01L 21/823878; H01L 29/0673; H01L 29/66439; H01L 29/775; H01L 21/8221; H01L 27/0688; H01L 27/092; H01L 29/78696; B82Y 10/00

USPC ........................................................ 257/401
See application file for complete search history.

(56) References Cited

U.S. PATENT DOCUMENTS

| 10,141,403 | B1 | 11/2018 | Cheng et al. |
| 10,269,920 | B2 | 4/2019 | Cheng et al. |
| 10,283,516 | B1 | 5/2019 | Reznicek et al. |
| 10,381,438 | B2 | 8/2019 | Zhang et al. |
| 10,608,082 | B2 | 3/2020 | Frougier et al. |
| 10,615,288 | B1 | 4/2020 | Kong et al. |
| 10,700,083 | B1 | 6/2020 | Ramkumar et al. |
| 2018/0248021 | A1 | 8/2018 | Bi et al. |
| 2019/0371903 | A1 | 12/2019 | Bao et al. |
| 2020/0083382 | A1 | 3/2020 | Xu et al. |
| 2020/0105762 | A1 | 4/2020 | Xiao |
| 2020/0168715 | A1 | 5/2020 | Wu et al. |
| 2020/0279845 | A1 | 9/2020 | Ma et al. |

(Continued)

OTHER PUBLICATIONS

A. Hubert et al., A stacked SONOS technology, up to 4 levels and 6nm crystalline nanowires, with gate-all-around or independent gates (φ-Flash), suitable for full 3D integration, IEEE, 2009.

(Continued)

*Primary Examiner* — Tong-Ho Kim

(57) ABSTRACT

A semiconductor device and fabrication method are described for integrating stacked top and bottom nanosheet transistors by providing a nanosheet transistor stack having bottom and top Si/SiGe superlattice structures (11-14, 17-20) which are separated from one another by a barrier oxide layer (15) and which are separately processed to form bottom gate electrodes having a first gate structure (40A-B) in the bottom Si/SiGe superlattice structures and to form top gate electrodes having a second, different gate structure (46A-B) in the top Si/SiGe superlattice structures.

11 Claims, 10 Drawing Sheets

(56) References Cited

U.S. PATENT DOCUMENTS

| | | |
|---|---|---|
| 2020/0287055 A1 | 9/2020 | Lee et al. |
| 2020/0294998 A1* | 9/2020 | Li .................... H01L 23/53295 |
| 2021/0320035 A1* | 10/2021 | Xie .................... H01L 21/3065 |
| 2022/0165731 A1* | 5/2022 | Huang ................ H01L 29/6684 |

OTHER PUBLICATIONS

Wikipedia, Accelerometer, downloaded from the Internet Dec. 23, 2020.

Southwest Center for Microsystems Education (SCME), Microcantilever Applications Overview, Primary Knowledge, Participant Guide, Feb. 2017.

Emilie Bernard et al., First Internal Spacers' Introduction in Record High ION/IOFF TiN/HfO2 Gate Multichannel MOSFET Satisfying Both High-Performance and Low Standby Power Requirements, IEEE Electron Device Letters, vol. 30, No. 2, Feb. 2009.

Semiconductor Engineering, Gate-All-Around FET (GAA FET), Nov. 12, 2019 https://semiengineering.com/knowledge_centers/integrated-circuit/transistors/3d/gate-all-around-fet/.

Peide Ye et al., The Nanosheet Transistor is the Next (and Maybe Last) Step in Moore's Law, Nanosheet devices are scheduled for the 3-nanometer node as soon as 2021, IEEE Spectrum, Jul. 30, 2019.

Mark Lapedus, Semiconductor Engineering, What's After FinFETs?, Jul. 24, 2017.

Jaclyn K. Sprenger et al., Electron-enhanced atomic layer deposition of silicon thin films at room temperature, J. Vac. Sci. Technol. A, vol. 36, No. 1, Jan./Feb. 2018.

\* cited by examiner

NANOSHEET TRANSISTORS WITH DIFFERENT GATE MATERIALS IN SAME STACK AND METHOD OF MAKING

BACKGROUND OF THE INVENTION

Field of the Invention

The present invention is directed in general to the field of semiconductor devices. In one aspect, the present invention relates to integrated nanosheet field effect transistor (FET) devices and methods of fabricating the same in a nanosheet process flow.

Description of the Related Art

As semiconductor device sizes are scaled down, the requirements for device design and fabrication continue to be tightened in order to fit more circuitry on smaller chips. As device sizes shrink, increasingly complex process integrations are used to define semiconductor device features and structures. For example, finFET transistors replaced planar FET transistors as the leading edge transistor architecture for 1×nm nodes, but with next-generation technologies, stacked nanosheet transistors are in line to replace finFETs as the leading edge transistor architecture starting at the 3 nm node. However, the existing solutions for fabricating nanosheet transistors are not well suited at a practical level for integrating nanosheet field effect transistor (FET) devices having different structural properties by virtue of the challenges with fabricating leading edge nanosheet transistors without separately processing different nanosheet transistor stacks which are laterally spaced apart from one another on the substrate, thereby increasing the die area and reducing design flexibility. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
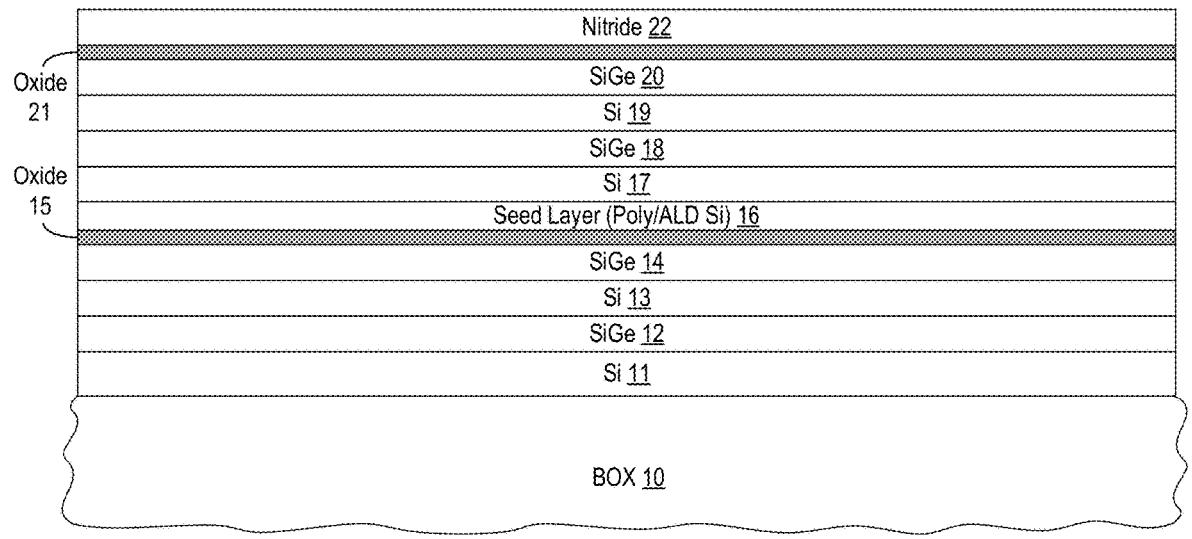
FIG. 1 is a partial cross-sectional view of a semiconductor structure including bottom and top stacked Si/SiGe superlattice structures formed over a substrate, separated from one another by a barrier oxide layer, and covered by protective nitride and oxide layers in accordance with selected embodiments of the present disclosure.

A semiconductor device and fabrication method are described for fabricating stacked nanosheet transistors with different gate structures and/or materials in the same stack in a single nanosheet process flow. While specific implementation details are described herein with reference to one or more example embodiments, the present disclosure is directed to an example processing sequence for fabricating nanosheet transistors in the same Si/SiGe stack with different gate materials using additional process steps that are minimized to reduce complexity and cost. The process steps used for fabricating the stacked nanosheet transistors with different gate structures or materials are standard process steps, so no new fab tools are needed in some embodiments. As an initial set of fabrication steps, a wafer substrate is formed with a stack of bottom and top Si/SiGe superlattice structures separated from one another by a barrier oxide layer, and then patterned and etched to form a transistor stack. With a second set of fabrication steps, the transistor stack is processed to partially etch exposed SiGe layers, thereby forming recess openings in the stacked bottom and top transistor stacks which are filled with first dielectric spacers, thereby defining remnant SiGe layers having a first gate length dimension. A third set of fabrication steps is applied to separately form epitaxial source/drain regions for each of the stacked bottom and top transistor stacks. With a fourth set of fabrication steps, the transistor stack is processed to access and selectively remove remnant SiGe layers in the transistor stack to form SiGe etch openings which are sequentially filled with first atomic layer deposition (ALD) oxide and metal layers to form gate stacks in the bottom and top transistor stacks. After sealing the bottom transistor stack with an organic oxide layer, a fifth set of fabrication steps is applied to remove the gate stacks from the top transistor stack to form SiGe etch openings which are sequentially filled with second ALD oxide and metal layers to form gate stacks in the top transistor stacks. By forming separate nanosheet transistors in the bottom and top transistor stacks that are separated vertically and insulated from one another, the bottom nanosheet transistor can use gate materials and thicknesses for a first transistor type (e.g., NMOS) and the top nanosheet transistor can use gate materials and thicknesses for a second transistor type (e.g., PMOS). An additional benefit of stacking transistors with different gate materials is that the bottom and top nanosheet transistors can be constructed with different threshold voltages. For example, the different gate materials could be different gate oxides and/or different work function-setting gate metals.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention. Further, reference numerals have been repeated among the drawings to represent corresponding or analogous elements. In addition, the depicted device layers that are shown as being deposited and/or etched are represented with simplified line drawings, though it will be appreciated that, in reality, the actual contours or dimensions of device layers will be non-linear, such as when the described etch processes are applied at different rates to different materials, or when the described deposition or growth processes generate layers based on the underlaying materials.

Various illustrative embodiments of the present invention will now be described in detail with reference to FIGS. 1-18. It is noted that, throughout this detailed description, certain layers of materials will be deposited and removed to form the semiconductor structure. Where the specific procedures for processing such layers or thicknesses of such layers are not detailed below, conventional techniques to one skilled in the art for depositing, removing or otherwise forming such layers at appropriate thicknesses shall be intended. Such details are well known and not considered necessary to teach one skilled in the art how to make or use the present invention.

As indicated above, the existing solutions for fabricating nanosheet transistors are not well suited at a practical level for integrating the nanosheet field effect transistor (FET) devices having different gate structures. For example, stacked nanosheet transistors have been proposed to promote higher device density by stacking nanosheet NMOS and PMOS transistors on top of each other in the same Si/SiGe stack, but such stacked arrangements typically form stacked transistors with uniform gate structures and materials. And while nanosheet transistors with different gate structures have been proposed, instead of being stacked on top of one another, the nanosheet transistors with different gate structures and/or materials are typically formed by separately processing different nanosheet transistor stacks which are laterally spaced apart from one another on the substrate, thereby increasing the die area and reducing design flexibility. The additional processing steps with such conventional solutions increase the cost, size, and complexity of fabricating integrated circuit devices which include nanosheet transistors.

Turning now to FIG. 1, a partial cross-sectional view illustrates a semiconductor structure 10-22 including a bottom Si/SiGe superlattice structure 11-14 and a top Si/SiGe superlattice structure 17-20 formed over a buried oxide (BOX) substrate layer 10 and separated from one another by a barrier oxide layer 15 and seed layer 16, and covered by protective oxide layer 21 and nitride layer 22 in accordance with selected embodiments of the present disclosure. Depending on the requirements for protecting against subsequent processing steps, the protective layers 21-22 may include additional or fewer layers. Though not shown, it will be appreciated that the semiconductor structure 10-22 is formed over an underlying substrate which may be implemented as a bulk silicon substrate, monocrystalline silicon (doped or undoped), or any semiconductor material including, for example, Si, SiC, SiGe, SiGeC, Ge, GaAs, InAs, InP as well as other Group III-V compound semiconductors or any combination thereof, and may be formed as the bulk handling wafer.

As will be appreciated, any suitable sequence of processing steps may be used to form the stacked bottom and top Si/SiGe superlattice structures 11-14, 17-20 on the base structure BOX layer 10. For example, the bottom Si/SiGe superlattice structure 11-14 may be formed by epitaxially growing a plurality of nanosheet semiconductor layers of alternating silicon (Si) 11, 13 and silicon germanium (SiGe) 12, 14. On the last SiGe layer 14, the barrier oxide layer 15 may be formed by depositing an oxide and/or other suitable dielectric layer using chemical vapor deposition (CVD), plasma-enhanced chemical vapor deposition (PECVD), physical vapor deposition (PVD), atomic layer deposition (ALD), thermal oxidation, or any combination(s) of the above to a predetermined thickness that will provide electrical insulation between the bottom and top Si/SiGe superlattice structures 11-14, 17-20. Subsequently, a seed layer 16 may be formed by depositing a layer of polysilicon, ALD silicon, and/or other suitable seed layer using CVD, PECVD, PVD, or any combination(s) of the above to a predetermined thickness that will provide a seed layer for epitaxially growing the subsequently formed silicon layer 17. On the seed layer 16, the top Si/SiGe superlattice structure 17-20 may be formed by epitaxially growing a plurality of nanosheet semiconductor layers of alternating silicon (Si) 17, 19 and silicon germanium (SiGe) 18, 20. As shown, each of the stacked Si/SiGe superlattice structures 11-14, 17-20 is a stack of alternating layers which includes a first group of layers 11, 13, 17, 19 that include silicon and a second group of layers 12, 14, 18, 20 that include silicon germanium. While each stacked Si/SiGe superlattice structure is shown with two silicon nanosheets, it will be appreciated that the number of silicon nanosheets may be decreased or increased (e.g., 4 Si nanosheets instead of 2 Si nanosheets) to optimize transistor performance. In addition, each stacked Si/SiGe superlattice structure may have a different number of nanosheets. If desired, the individual layers of the stacked Si/SiGe superlattice structures 11-14, 17-20 may be doped or implanted with impurities to separately control the conductivity of the stacked Si/SiGe superlattice structures 11-14, 17-20.

The terms "epitaxial growth, "epitaxial deposition" and "epitaxial formation" all refer generally to a semiconductor process for growing a semiconductor material or layer having a (substantially) crystalline structure on a deposition surface of seed semiconductor material or layer having a (substantially) crystalline structure such that the semiconductor material/layer being grown has substantially the same crystalline characteristics as the seed semiconductor material/layer. In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

After forming the stacked Si/SiGe superlattice structures 11-14, 17-20, a first insulator or dielectric layer 21 is formed, such as by depositing or otherwise forming a protective oxide layer 21 over the semiconductor substrate using CVD, PECVD, PVD, ALD, thermal oxidation, or any combination(s) of the above to a thickness of approximately 20-200 Angstroms, though a thinner or thicker oxide layer may also be used. In addition, an additional insulator or dielectric layer 22 may be formed on the protective oxide layer 21, such as by depositing or otherwise forming a protective nitride layer 22 to a predetermined thickness. And depending on the subsequent processing requirements, an additional insulator or dielectric layer may be formed on the protective insulator layer 22, such as by depositing or otherwise forming a protective oxide layer to a predetermined thickness. As will be appreciated, the unetched semiconductor structure layers 11-22 are formed to cover the entire top surface of the buried oxide layer 10, including the intended nanosheet transistor areas.

Figure 2:
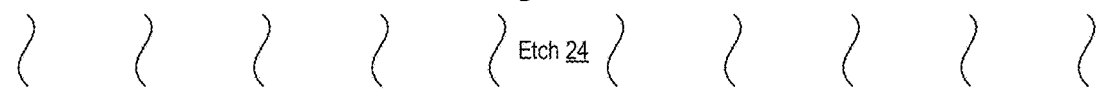
FIG. 2 illustrates processing subsequent to FIG. 1 after the stacked Si/SiGe superlattice structures and barrier oxide layer are patterned and etched to form a transistor stack.
Figure 2:
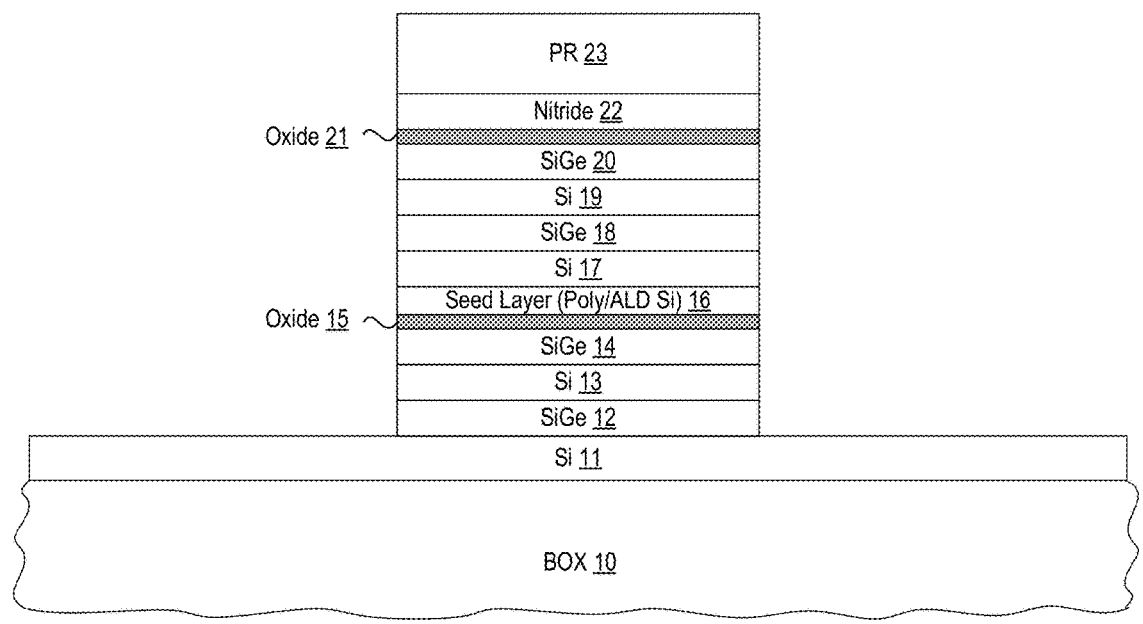

FIG. 2 illustrates processing of the semiconductor structure subsequent to FIG. 1 after the stacked Si/SiGe superlattice structures 11-14, 17-20, barrier oxide layer 15, and seed layer 16 are patterned and etched to form a transistor stack. While any suitable pattern and etch process may be used, a first patterned mask 23 may be formed over the unetched semiconductor structure layers 11-22 by depositing, patterning, etching or developing a photoresist or hard mask layer on the protective nitride layer 22. With the patterned photoresist mask 23 in place, one or more etch processes 24 are applied to create a transistor stack 12-22. The etch processing 24 can include using the patterned photoresist mask 23 to perform a sequence of reactive-ion etching (RIE) steps having suitable etch chemistry properties to remove, in sequence, the exposed portions of the protective nitride layer 22, protective oxide layer 21, and underlying layers of the top Si/SiGe superlattice structure 17-20, seed layer 16, barrier oxide layer 15, and bottom Si/SiGe superlattice structure 12-14. As will be appreciated, the sidewalls of the transistor stack 12-22 are substantially vertical, though minor deviations in the sidewall profile may occur at each layer due to etch processing variations.

Figure 3:
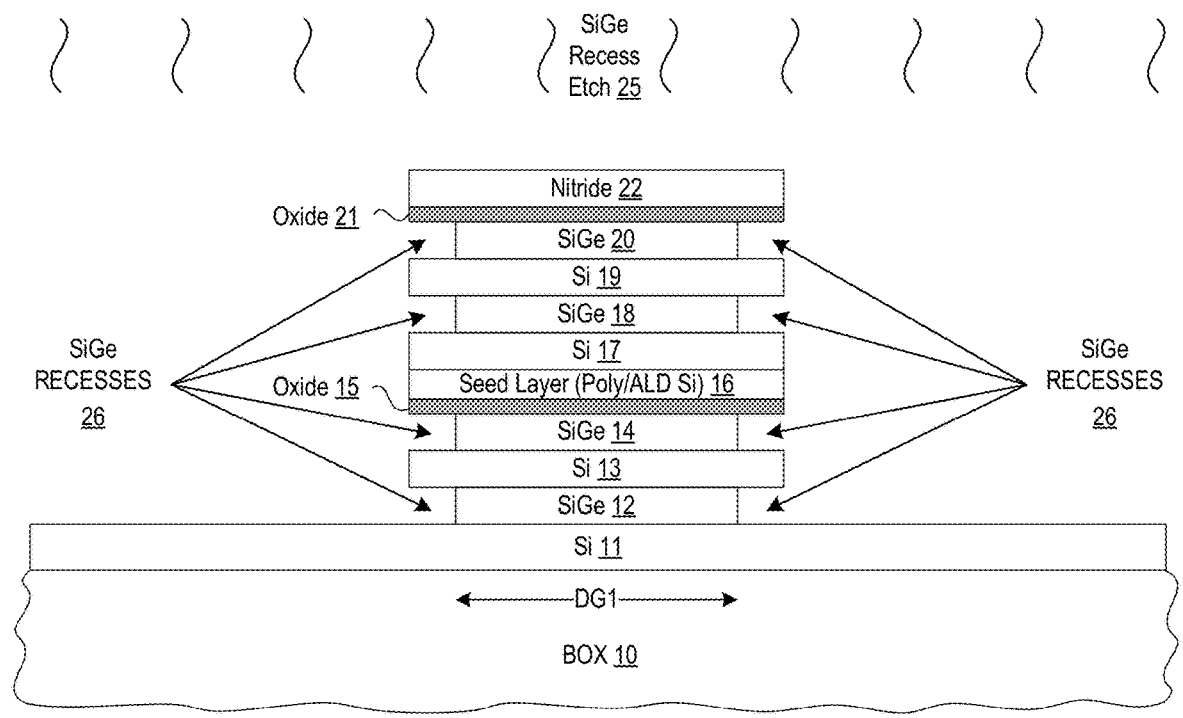
FIG. 3 illustrates processing subsequent to FIG. 2 after partially etching exposed SiGe layers in the transistor stack to form recess openings which define remnant SiGe layers having a first gate length dimension.

FIG. 3 illustrates processing of the semiconductor structure subsequent to FIG. 2 after partially etching exposed SiGe layers in the transistor stack 12-22 to form recess openings 26 which define remnant SiGe layers 12, 14, 18, 20 having a first gate length dimension DG1. At the depicted processing stage, the patterned mask 23 has been removed using any suitable stripping process and a selective SiGe recess etch 25 is applied to selectively and isotropically recess the SiGe layers on the exposed sides of the transistor stack 12-22. While any suitable SiGe etch process may be used, a controlled SiGe recess etch process 25, such as a timed isotropic dry etch, may be used to remove a portion of each SiGe layer from the exposed sides of the transistor stack 12-22. At the conclusion of the etching process, the remnant SiGe portions 12, 14, 18, 20 of the bottom and top transistor stack remain where the recess openings 26 have not been formed, and will define a first gate length dimension DG1 for the subsequently formed bottom and top nanosheet transistors. As will be appreciated, the etched sidewall edges of the remnant SiGe portions 12, 14, 18, 20 may have a substantially vertical or slightly curved profile resulting from the selective SiGe recess etch 25.

Figure 4:
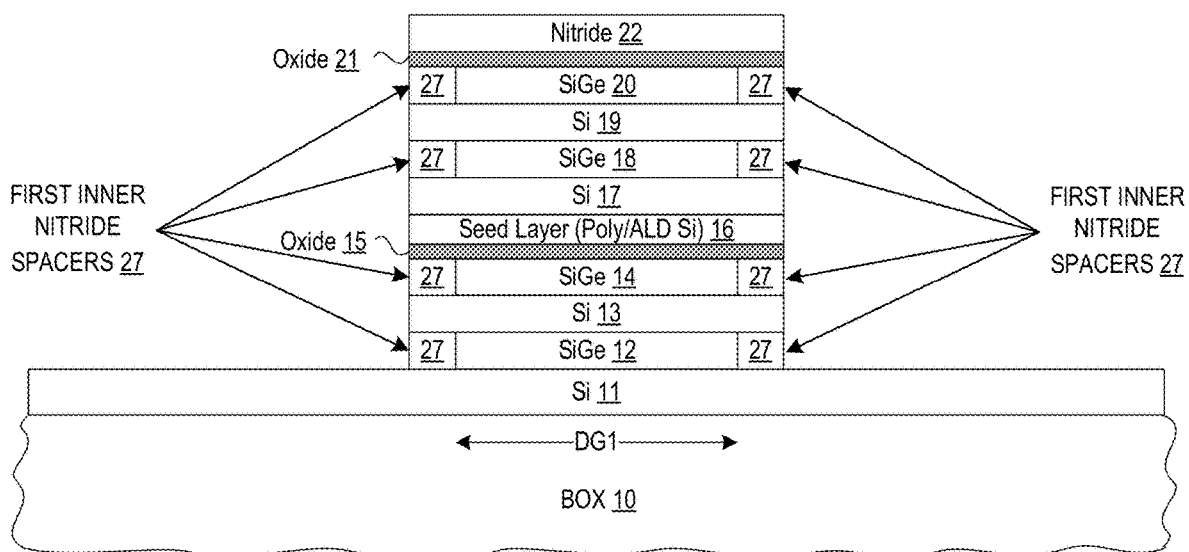
FIG. 4 illustrates processing subsequent to FIG. 3 after forming first inner nitride spacers to fill the recess openings on the exposed sides of the transistor stack.

FIG. 4 illustrates processing of the semiconductor structure subsequent to FIG. 3 after forming first inner dielectric spacers 27 to fill recess openings 26 on the exposed sides of the transistor stack 11-22. While any suitable spacer formation sequence may be used, the first inner dielectric spacers 27 may be formed by depositing one or more nitride layers or other suitable dielectric layers over the semiconductor structure (not shown) that are subsequently etched to remove the nitride/dielectric layer(s) from the top and sides of the transistor stack 11-22 but leaving remnant dielectric spacers 27 in the recess openings 26 at the exposed sides of the transistor stack 11-22. For example, an inner nitride layer may be deposited over the semiconductor structure to a predetermined thickness that is sufficient to cover at least the transistor stack 11-22 and fill the recess openings 26 on the exposed sides thereof. By applying an isotropic nitride etch process (e.g., a plasma etch) to remove the inner nitride layer from the top and sides of the transistor stack 11-22, the remnant inner nitride layers form sidewall spacers 27 on the transistor stack. As will be appreciated, the etched sidewall edges of the remnant nitride spacers 27 may have a substantially vertical or slightly curved profile resulting from the applied isotropic nitride etch process.

Figure 5:
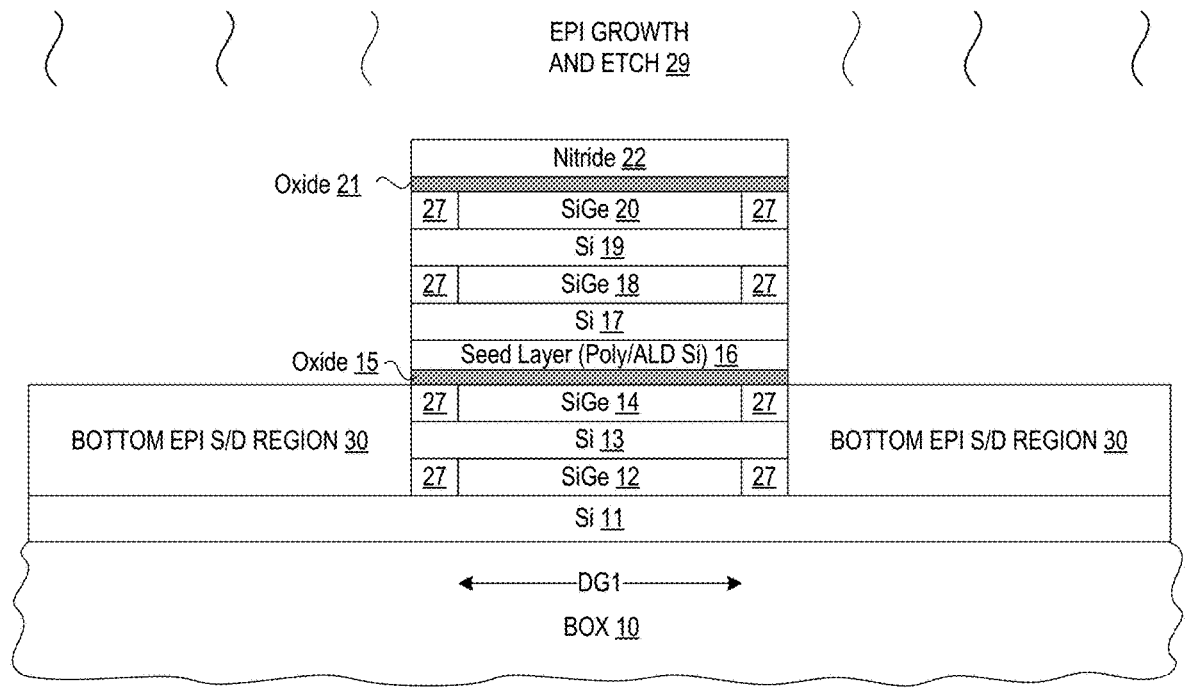
FIG. 5 illustrates processing subsequent to FIG. 4 after forming epitaxial source/drain regions adjacent to the bottom transistor stack.

FIG. 5 illustrates processing of the semiconductor structure subsequent to FIG. 4 after forming bottom epitaxial source/drain regions 30 adjacent to the bottom transistor stack. As will be appreciated, an epitaxial silicon deposition or growth process 29 may be used to form epitaxial source/drain regions from the bottom semiconductor layer 11 and any exposed silicon layers 13, 16-17 and 19 that extend up to the uppermost silicon layer 19. Thus formed, an epitaxial silicon etch process may be applied to partially etch the epitaxial source/drain regions to form bottom epitaxial source/drain regions 30 which expose the top transistor stack 17-20 and seed layer 16. With the protective nitride layer 22 forming a protective etch mask, any suitable epitaxial silicon etch process 29 may be used, such as a timed anisotropic epitaxial silicon etch process 29 (e.g., RIE) that is applied to recess the top surface of the source/drain regions by controlling the etch timing to leave the uppermost surface of the etched source/drain regions 30 in substantial alignment with the upper surface of the bottom transistor stack 11-14. At this point, the bottom epitaxial source/drain regions 30 can be doped using any suitable doping technique. For example, the bottom epitaxial source/drain regions 30 may be in-situ doped during the epi process, such as by doping epitaxially grown source/drain features with boron, arsenic and/or phosphorus to form doped bottom epitaxial source/drain regions 30. In some embodiments, the source/drain features are not in-situ doped, and instead an implantation process is performed to dope the bottom epitaxial source/drain regions 30. As will be appreciated, the doping dose used to dope the bottom epitaxial source/drain regions 30 is greater than a doping dose (if any) used to dope the channel regions in the silicon layers 11, 13. In addition, the formation of the source/drain regions 30 may be performed with doping that is appropriate for the bottom transistor stack 11-14 to have N-type or P-type source/drain features. In some embodiments, after formation of the bottom epi source/drain regions 30, an epi anneal process may be performed to promote formation of crystalline structures in the epitaxial source/drain regions 30, such as by applying a high thermal budget process. In addition, one or more etch steps may be applied to planarize the top surface of the bottom epitaxial source/drain regions 30.

Figure 6:
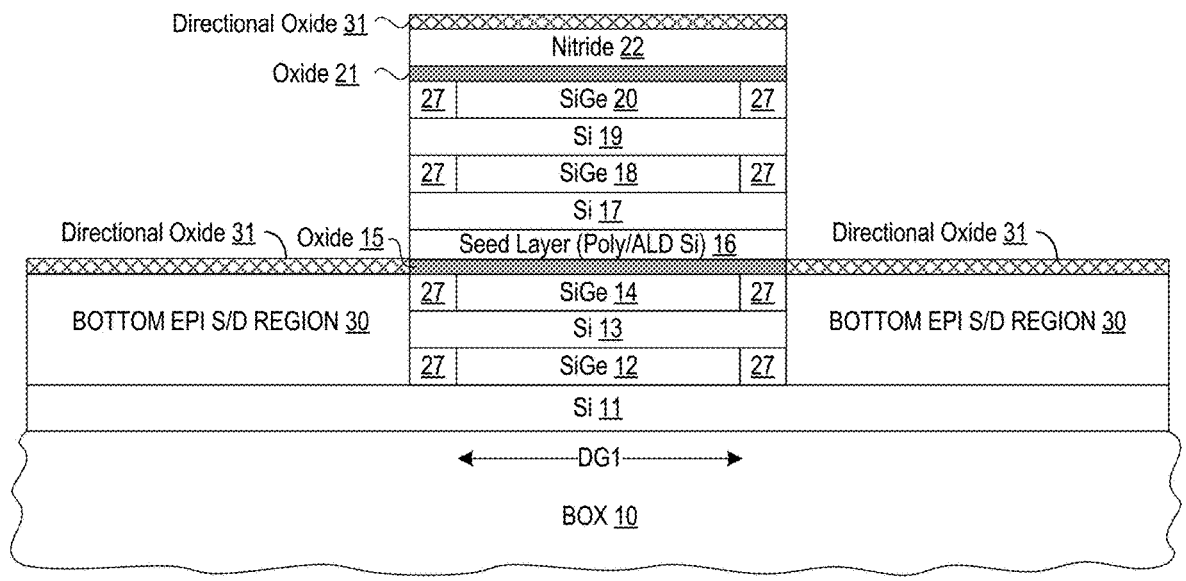
FIG. 6 illustrates processing subsequent to FIG. 5 after forming a directional oxide layer to cover at least the bottom epitaxial source/drain regions.

FIG. 6 illustrates processing of the semiconductor structure subsequent to FIG. 5 after forming a directional insulating layer 31 to cover at least the bottom epitaxial source/drain regions 30. While any suitable process may be used, the directional insulating layer 31 may be formed by using PECVD to deposit a layer of tetraethyl orthosilicate (TEOS) as a directional oxide layer 31 on horizontal top surfaces on the etched source/drain regions 30 and transistor stack. To remove any remnant oxide from the vertical or sidewall surfaces, a short hydrofluoric (HF) acid etch may be applied to clear any thin oxide from the sidewalls if necessary. As finally formed, the thickness and material for the directional insulating layer 31 should be chosen to provide electrical insulation between the stacked nanosheet transistors that are formed in the top and bottom transistor stacks.

Figure 7:
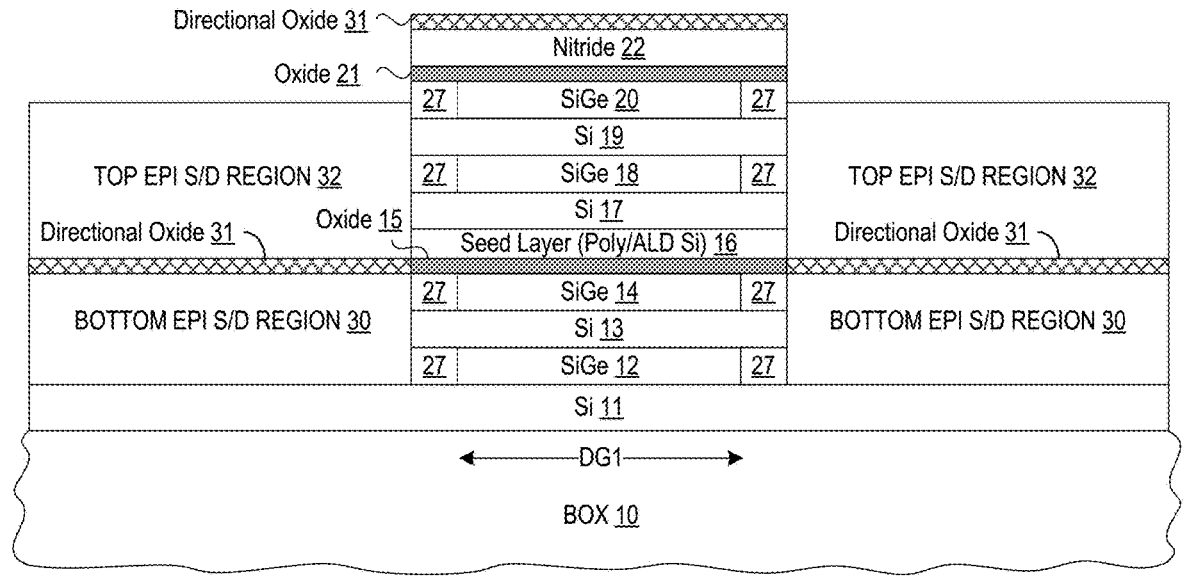
FIG. 7 illustrates processing subsequent to FIG. 6 after forming epitaxial source/drain regions adjacent to the top transistor stack which are separated from the bottom epitaxial source/drain regions by the directional oxide layer.

FIG. 7 illustrates processing of the semiconductor structure subsequent to FIG. 6 after forming top epitaxial source/drain regions 32 adjacent to the top transistor stack 16-20 which are physically and electrically separated from the bottom epitaxial source/drain regions 30 by the directional oxide layer 31. As a result of the directional insulating layer 31, the bottom source/drain regions 30 may be separately accessed from the top source/drain regions. While any suitable epitaxial source/drain fabrication sequence may be used, the top epi source/drain regions 32 may be formed by epitaxially growing or depositing a semiconductor layer 32 (e.g., silicon) in the regions adjacent to the top transistor stack 16-20. As will be appreciated, the epitaxial silicon deposition or growth process forms the epitaxial source/drain regions 32 from the seed layer 16 and any exposed silicon layers 17, 19. At this point, the top epitaxial source/drain regions 32 can be doped using any suitable doping technique, such as by performing in-situ doping during the epi process with boron, arsenic and/or phosphorus to form doped top epitaxial source/drain regions 32. Alternatively, an implantation process may be performed to dope the top epitaxial source/drain regions 32. In either case, the doping dose used to dope the top epitaxial source/drain regions 32 is greater than a doping dose (if any) used to dope the channel regions in the silicon layers 17, 19. In addition, the formation of the top epi source/drain regions 32 may be performed with doping that is appropriate for the top transistor stack 17-20 to have N-type or P-type source/drain features. In some embodiments, after formation of the top epi source/drain regions 32, an epi anneal process may be performed to promote formation of crystalline structures in the epitaxial source/drain regions 32. In addition, one or more etch or polish steps may be applied to planarize the top surface of the top epitaxial source/drain regions 32 so that it is substantially level with the top of the top transistor stack 16-20.

Figure 8:
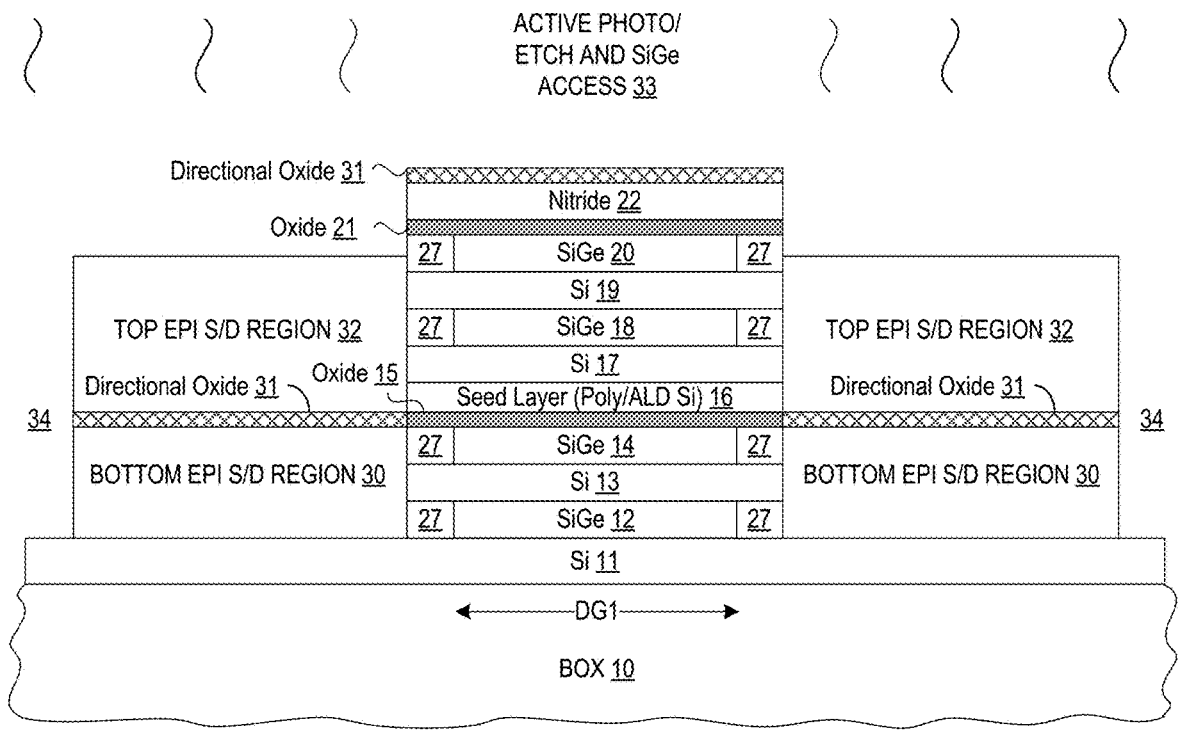
FIG. 8 illustrates processing subsequent to FIG. 7 after the transistor stack is patterned and etched to expose the SiGe layers in the transistor stack.

FIG. 8 illustrates processing of the semiconductor structure subsequent to FIG. 7 after the transistor stack is patterned and etched with an active photo/etch and SiGe access process 33 to expose the remnant SiGe layers 12, 14, 18, 20 in the transistor stack to a subsequent SiGe etch process. In addition, the photo/etch and SiGe access process 33 could also be used to form etch openings 34 through the top and bottom epitaxial source/drain region 32, 30 to expose the underlying silicon layer 11. While the depicted cross-sectional drawing does not show etch openings that expose the remnant SiGe layers 12, 14, 18, 20, it will be appreciated that the etch openings may be formed in the z-axis plane (in and out of the paper) to expose peripheral ends of the remnant SiGe layers 12, 14, 18, 20. While any suitable pattern and etch process may be used, the active photo/etch and SiGe access process 33 may include forming a patterned mask (not shown) over the semiconductor structure by depositing, patterning, etching or developing a photoresist or hard mask layer on the upper epitaxial source/drain regions 32 and transistor stack. With the openings formed in the patterned photoresist/hard mask, the active photo/etch and SiGe access process 33 may also include one or more etch processes that are applied to create SiGe access openings which expose at least the remnant SiGe layers 12, 14, 18, 20. The etch processing 33 can include performing a sequence of reactive-ion etching (RIE) steps having suitable etch chemistry properties to remove, in sequence, the exposed portions of the directional oxide layer 31, protective nitride layer 22, protective oxide layer 21, and underlying layers of the transistor stack 12-20.

Figure 9:
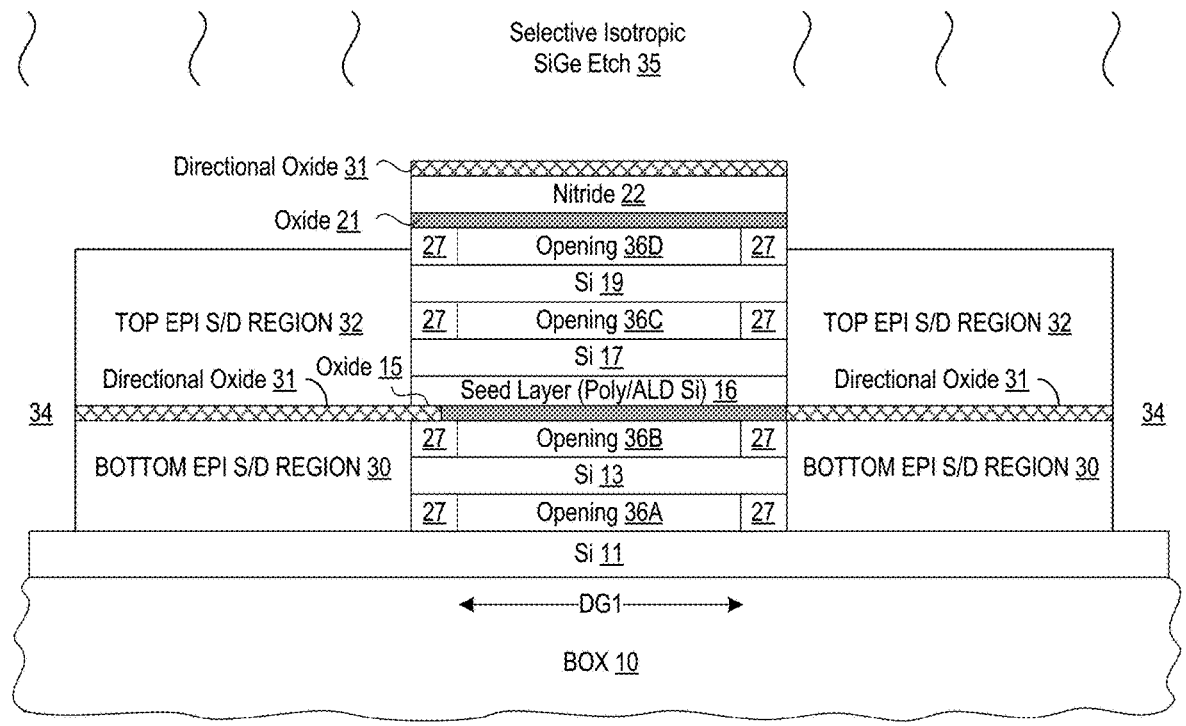
FIG. 9 illustrates processing subsequent to FIG. 8 after selectively etching exposed SiGe layers to form gate openings in the transistor stack.

FIG. 9 illustrates processing of the semiconductor structure subsequent to FIG. 8 after applying a SiGe etch process 35 to selectively etch exposed remnant SiGe layers 12, 14, 18, 20, thereby forming gate openings 36A-D in the transistor stack. While any suitable SiGe etch process may be used, a selective isotropic SiGe etch process 35, such as a timed isotropic dry etch, may be used to remove the exposed remnant SiGe layers 12, 14, 18, 20 from the transistor stack. At the conclusion of the SiGe etching process 35, the remnant SiGe portions 12, 14, 18, 20 of the transistor stack are replaced by gate openings 36A-D where the gate electrodes for the nanosheet transistors will be formed in the top and bottom transistor stacks.

Figure 10:
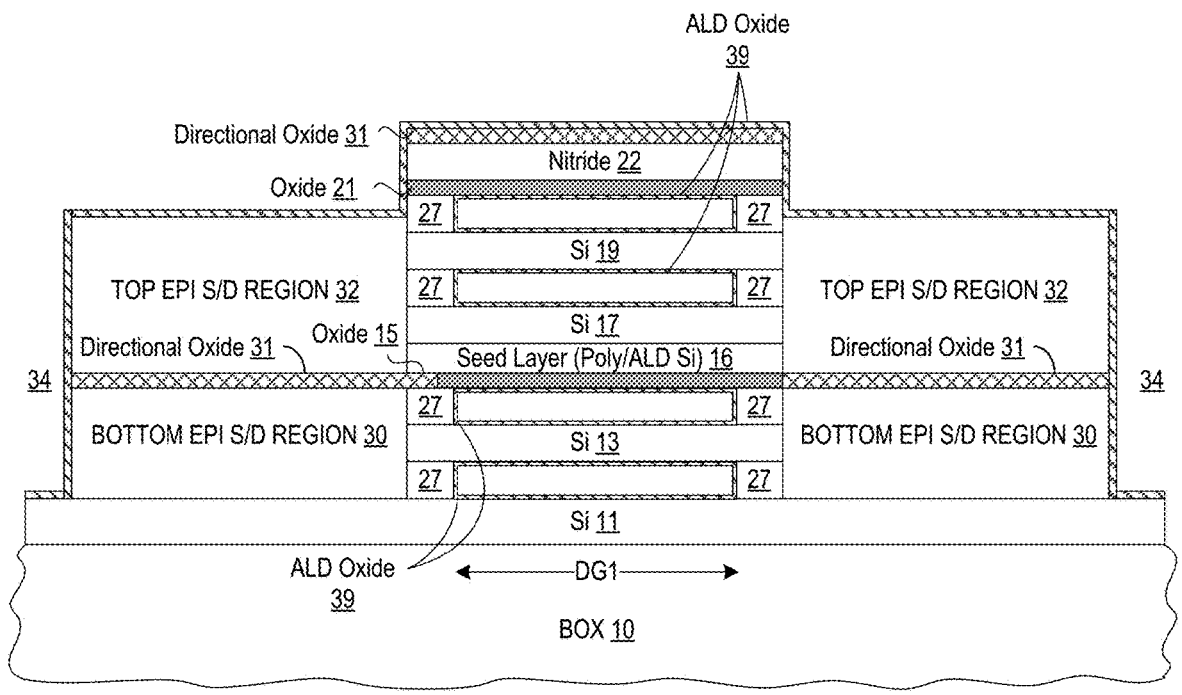
FIG. 10 illustrates processing subsequent to FIG. 9 after an atomic layer deposition (ALD) oxide layer is formed as a liner layer in the gate openings of the transistor stack.

FIG. 10 illustrates processing of the semiconductor structure subsequent to FIG. 9 after a first conformal gate dielectric layer 39 is formed as a liner layer in at least the gate openings 36A-D of the top and bottom transistor stacks. In selected embodiments, the first conformal gate dielectric layer 39 is formed with a first dielectric material (e.g., hafnium oxide) using an atomic layer deposition (ALD) process to conformally deposit a first ALD oxide layer 39 to a desired gate dielectric thickness (e.g., 5-50 Angstroms) on the interior surfaces of the gate openings 36A-D without completely filling the gate openings. In selected embodiments, the ALD oxide deposition process may by implemented by exposing the semiconductor structure to a precursor, evacuating or purging the precursors as well as byproducts from the chamber, exposing the semiconductor structure to reactant species (e.g., oxidants or other reagents), and evacuating or purging the reactants and byproduct molecules from the chamber. As a result, the ALD oxide deposition process offers accurate control of film thickness and composition as well as the ability to achieve excellent uniformity over large areas at relatively low temperatures. In addition to forming gate dielectric layers in the gate openings 36A-D, the resulting ALD oxide 39 forms a substantially conformal layer over the upper surface of the semiconductor structure.

Figure 11:
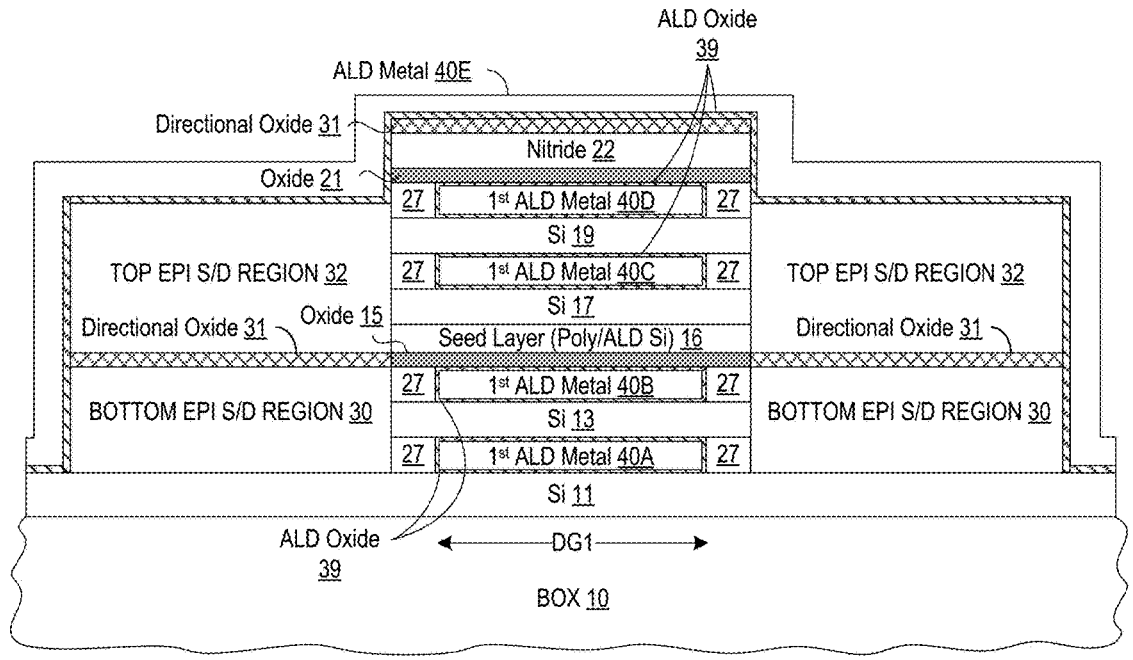
FIG. 11 illustrates processing subsequent to FIG. 10 after a first atomic layer deposition (ALD) metal layer is formed as a liner layer to at least fill the gate openings of the transistor stack.

FIG. 11 illustrates processing of the semiconductor structure subsequent to FIG. 10 after a first atomic layer deposition (ALD) metal layer 40 is formed as a liner layer to at least fill the gate openings of the transistor stack, thereby forming gate electrodes 40A-D in remaining gate openings 36A-D of the top and bottom transistor stacks. In selected embodiments, the conductive gate electrode layer(s) 40A-D are formed with a first gate conductor material (e.g., titanium nitride) using an atomic layer deposition (ALD) process to conformally deposit at least a first ALD metal layer 40A-D on the first ALD oxide layers 39, thereby at least partially filling the remaining gate openings 36A-D. In selected embodiments, the ALD metal deposition process may be implemented by exposing the semiconductor structure to a precursor, evacuating or purging the precursors as well as byproducts from the chamber, exposing the semiconductor structure to reactant species (e.g., metals or other reagents), and evacuating or purging the reactants and byproduct molecules from the chamber. In addition to forming gate electrode layers 40A-D in the gate openings 36A-D, the ALD metal process forms an ALD metal layer 40E as a substantially conformal layer over the upper surface of the semiconductor structure. By selecting first dielectric and gate conductor materials, performance parameters (e.g., threshold voltage, work function, etc.) and/or device type for the nanosheet transistors formed in the bottom transistor stack can be controlled separately from the nanosheet transistors formed in the top transistor stack.

Figure 12:
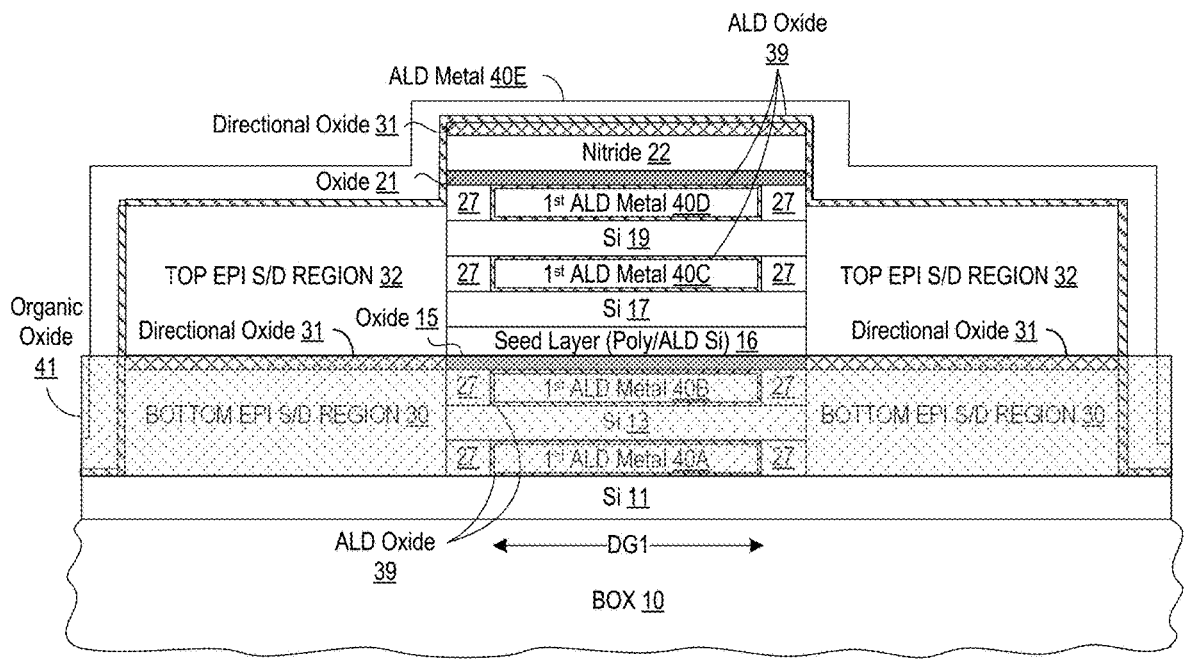
FIG. 12 illustrates processing subsequent to FIG. 11 after forming a first organic oxide layer over the substrate to protect the bottom transistor stack from subsequent processing.

FIG. 12 illustrates processing of the semiconductor structure subsequent to FIG. 11 after forming a first organic oxide layer 41 or other suitable protective structure over the substrate to protect the bottom transistor stack from subsequent processing. In selected embodiments, the first organic oxide layer 41 may be formed with a deposition process where a layer of organic oxide is spun on like resist to flow into the low regions of the semiconductor structure. By controlling the amount of organic oxide layer 41 that is deposited to fill up to the oxide barrier layer 15, the organic oxide layer 41 covers the bottom transistor stack, including channels 11, 13, gate electrodes 40A/B, bottom epi source/drain regions 30, and lower portions of the etch openings 34. In other embodiments, oxide sidewall spacers could be formed in the etch openings 34 on the vertical sidewalls of the bottom epi source/drain regions 30 and the vertical sidewalls of the transistor stack to protect the bottom transistor stack by depositing and anisotropically etching an oxide layer (not shown). As formed, the organic oxide layer 41 or oxide sidewall spacers (not shown) will protect the bottom transistor stack while the top transistor stack is subsequently processed.

Figure 13:
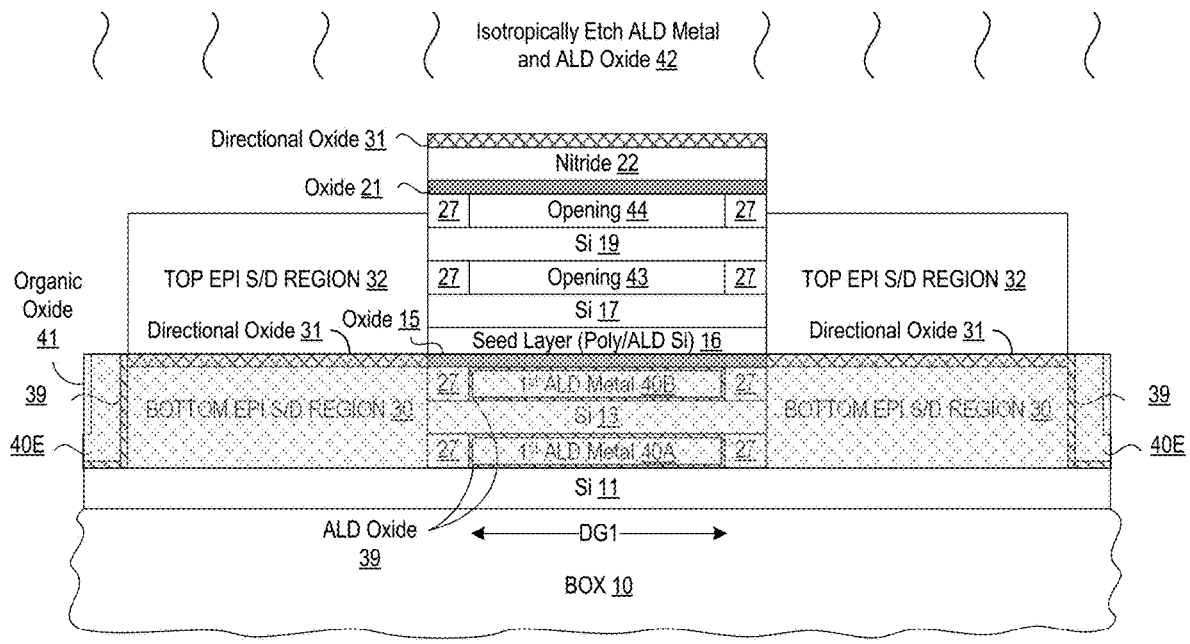
FIG. 13 illustrates processing subsequent to FIG. 12 after selectively etching exposed first ALD metal layer and first ALD oxide layer to form gate openings in the top transistor stack.

FIG. 13 illustrates processing subsequent to FIG. 12 after applying one or more etch processes 42 to selectively etch the exposed first ALD metal layers 40C-E and first ALD oxide layer 39 to form gate openings 43-44 in the top transistor stack. As will be appreciated, the presence of the organic oxide layer 41 protects the gate electrode stacks 39/40A/40B in the bottom transistor stack, as well as the first ALD metal layer 40E and first ALD oxide layer 39 on the sidewall of the bottom transistor stack, from being removed by the etch processes 42. While any suitable etch process 42 may be used, the etch processing can include one or more first isotropic etch steps (e.g., a wet etch process) having suitable etch chemistry properties to remove the exposed first ALD metal layers 40C-E. In addition, the etch processing 42 may include one or more second isotropic etch steps (e.g., a wet etch process) having suitable etch chemistry properties to remove the exposed first ALD oxide layer 39 from the top of the semiconductor structure and from the gate openings 43-44 in the top transistor stack. By using an isotropic wet etch process designed to etch the first ALD oxide layer 39 specifically, the protective oxide 21, protective organic oxide layer 41, and remnant directional oxide 31 on the transistor stack are not removed or may be only partially etched so that there are only minor deviations in the layer profiles caused by the wet etch process.

At the depicted stage of processing, the first ALD metal layers 40C-E and first ALD oxide layer 39 in the top transistor stack have been removed to form the gate openings 43-44 in the top transistor stack, while the gate stacks 39/40A-B in the bottom transistor stack are left intact and protected by the first organic oxide layer 41. In addition, the first organic oxide layer 41 protects the first ALD metal layer 40E and first ALD oxide layer 39 on the vertical sidewalls of the bottom epitaxial source/drain regions 30 (as shown). Though not shown, the first organic oxide layer 41 also protects the first ALD metal layer 40E and first ALD oxide layer 39 on the vertical sidewalls of the bottom transistor stack layers 27/40A/27, Si 13, 27/40B/27, 31 in the z-axis plane (in and out of the paper). As a result, the first ALD metal layer 40E and first ALD oxide layer 39 on the vertical sidewalls of the bottom transistor stack layers are exposed at the top of the first organic oxide layer 41 to subsequent fabrication processing whereby the second ALD oxide layer 45 and second ALD metal layer 46 are formed, as described hereinbelow.

Figure 14:
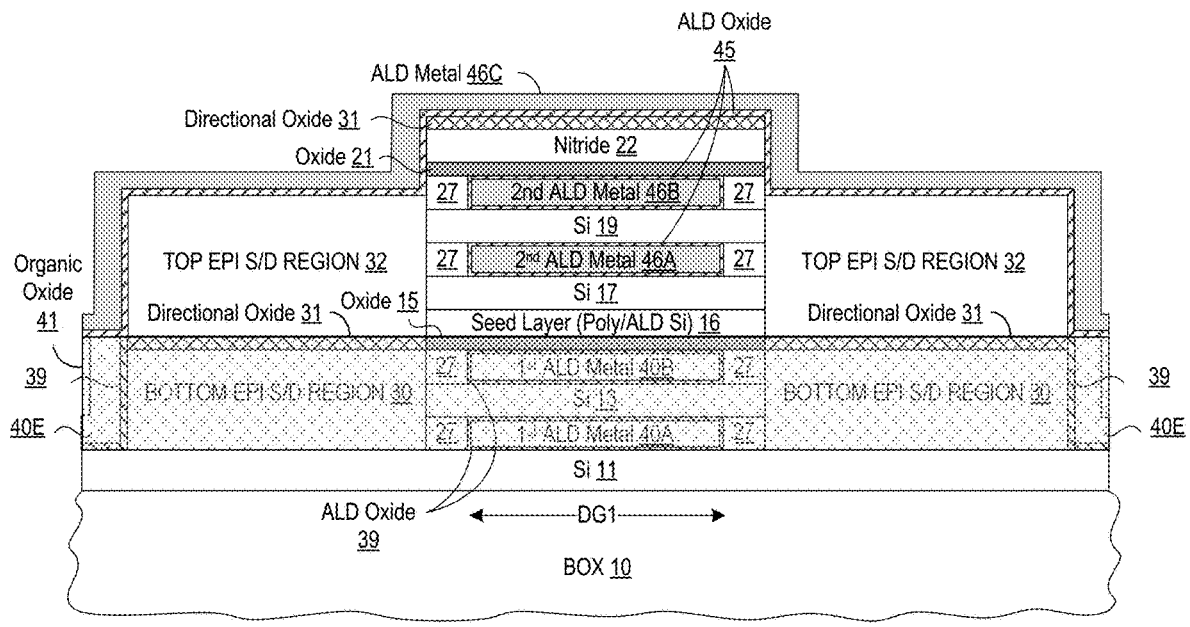
FIG. 14 illustrates processing subsequent to FIG. 13 after a second ALD oxide and second ALD metal layer are formed to fill the gate openings of the top transistor stack.

FIG. 14 illustrates processing of the semiconductor structure subsequent to FIG. 13 after forming a second conformal gate dielectric layer 45 and a second ALD metal layer 46 to fill the gate openings 43-44 of the top transistor stack. At the depicted stage of processing, the second ALD oxide layer 45 and second ALD metal layer 46 are sequentially deposited over the top and sides of the semiconductor structure, including the top transistor stack, top epi source/drain regions 32, and first organic oxide layer 41. In selected embodiments, the second conformal gate dielectric layer 45 is formed with a second dielectric material (e.g., zirconium oxide) using an ALD process to conformally deposit a second ALD gate dielectric layer 45 to a desired gate dielectric thickness (e.g., 5-50 Angstroms) on the interior surfaces of the gate openings 43-44 without completely filling the gate openings. In selected embodiments, the thickness and/or material for the second ALD gate dielectric layer 45 may be different from the thickness and/or material of the first ALD gate dielectric layer 39. In other embodiments, the thickness and/or material for the first and second ALD gate dielectric layers 39, 45 may be the same.

After forming the second ALD oxide layer 45, a second ALD metal layer 46 is formed as a liner layer to at least fill the gate openings 43-44 of the top transistor stack, thereby forming second gate electrodes 46A-B. In selected embodiments, the conductive gate electrode layer(s) 46A-B are formed with a second gate conductor material (e.g., titanium aluminum) using an ALD process to conformally deposit at least a second ALD metal layer 46A-B on the second ALD oxide layer 45, thereby at least partially filling the remaining gate openings 43-44. In selected embodiments, the thickness and/or material of the second ALD gate metal layer 46 may be different from the thickness and/or material of the first ALD gate metal layer 40, thereby inducing a different work function for transistors formed in the top transistor stack. In other embodiments, the thickness and/or material for the first and second ALD gate metal layers 40, 46 may be the same. In addition to forming second gate electrode layers 46A-B in the gate openings 43-44, the second ALD metal process forms a second ALD metal layer 46C as a substantially conformal layer over the upper surface of the semiconductor structure. By selecting the materials and/or thicknesses of the second gate dielectric and gate conductor layers 45, 46 to be different from the materials and/or thicknesses of the first gate dielectric and gate conductor layers 39, 40, performance parameters (e.g., threshold voltage, work function, etc.) and/or device type for the nanosheet transistors formed in the top transistor stack can be controlled separately from the nanosheet transistors formed in the bottom transistor stack.

Depending on the fabrication processing, the second ALD metal layer 46 may be formed on the second ALD oxide layer 45 which isolates the second ALD metal layer 46 from the first ALD metal layer 40E on the vertical sidewalls of the bottom epitaxial source/drain regions 30 and bottom transistor stack layers, thereby enabling different gate potentials to be applied to the bottom and top transistors. Though not shown, it will be appreciated that the second ALD metal layer 46 may instead be formed to directly contact the first ALD metal layer 40E on the vertical sidewalls of the bottom transistor stack layers, thereby enabling the same gate potential to be applied to the bottom and top transistors.

Figure 15:
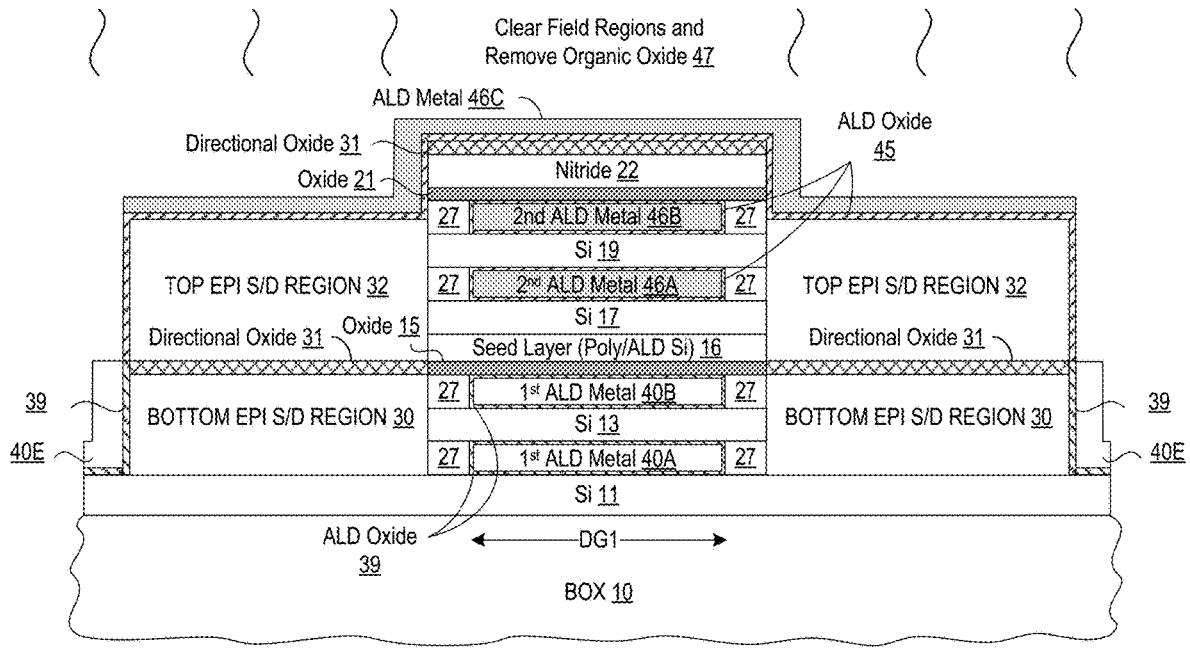
FIG. 15 illustrates processing subsequent to FIG. 14 after clearing the field regions and selectively removing the first organic oxide layer.

FIG. 15 illustrates processing of the semiconductor structure subsequent to FIG. 14 after one or more etch processes 47 are applied to clear the field regions (e.g., the non-transistor regions) and to selectively remove the exposed first organic oxide layer 41. To clear the field regions, a photo/etch process may be applied by forming a patterned etch mask (not shown) over the transistor stack and source/drain regions to protect the second gate dielectric and gate conductor layers 45, 46 before applying one or more suitable etch processes to remove the exposed second gate dielectric and gate conductor layers 45, 46 from the field regions. After removing the patterned etch mask, the organic oxide layer 41 may be removed with any suitable etch processing, such as by applying one or more isotropic etch steps (e.g., a wet etch process) having suitable etch chemistry properties to remove the first organic oxide layer 41 from the bottom nanosheet transistor. By using an isotropic wet etch process designed to etch organic oxide specifically, the second ALD metal layer 46C and second ALD oxide layer 45 on transistor stack and top epi source/drain regions 32 are substantially left in place.

Figure 16:
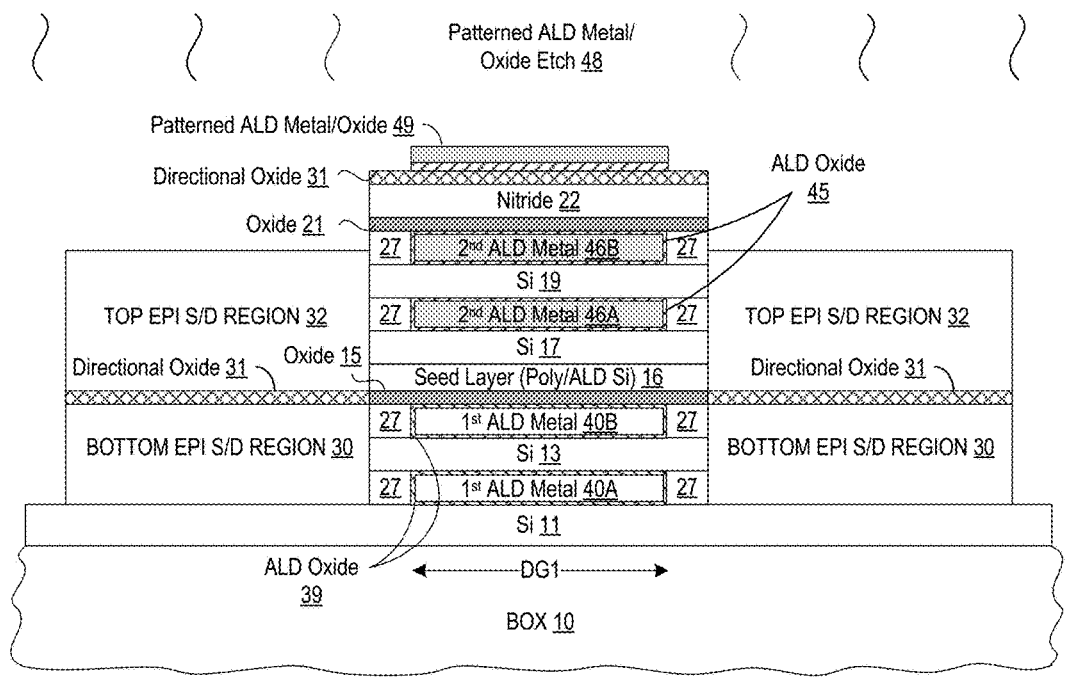
FIG. 16 illustrates processing subsequent to FIG. 15 after a patterned metal etch process is applied to form a patterned ALD metal layer on the upper surface and sidewalls of the transistor stack.

FIG. 16 illustrates processing of the semiconductor structure subsequent to FIG. 15 after a patterned metal etch process 48 is applied to selectively remove first ALD metal layer 40E and second ALD metal layer 46C to form a patterned ALD metal/oxide layer 49 on the upper surface and sidewalls (into and out of the page) of the transistor stack. As depicted, the patterned ALD metal/oxide layer 49 will include top gate layers having a gate length dimension that matches the gate length dimension DG1 of the top and bottom gate electrodes 40A-B, 46A-B on the bottom and top transistor stacks. The patterned ALD metal/oxide layer 49 will include portions that extend down the transistor stack sidewalls to contact the top gate electrodes 46A-B of the top transistor stack and/or the bottom gate electrodes 40A-B of the bottom transistor stack. While any suitable pattern and etch process may be used, the patterned metal etch process 48 may include forming a patterned mask (not shown) over the semiconductor structure by depositing, patterning, etching or developing a photoresist or hard mask layer to define openings where one or more etch processes are applied to create the top gate layers, including the patterned ALD metal/oxide layer 49 on the upper surface of the transistor stack. The etch processing 48 can include performing a sequence of reactive-ion etching (RIE) steps having suitable etch chemistry properties to remove, in sequence, the exposed portions of the first ALD metal layer 40E and first ALD oxide layer 39 on the bottom transistor stack as well as the second ALD metal layer 46 and second ALD oxide layer 45 on the top transistor stack, thereby leaving the underlying patterned ALD metal/oxide layer 49.

As described above, the deposited second ALD oxide layer 45 may be positioned on the vertical sidewalls of the bottom transistor stack layers to isolate the first metal gates 40A, 40B from the second metal gates 46A, 46B, thereby enabling different gate potentials to be applied to the bottom and top transistors. However, the deposited second ALD oxide 45 may also be patterned and etched so that the second ALD metal layer 46 on the makes direct contact to the top horizontal surface of the first ALD metal layer 40 on the sidewalls of the transistor stack, in which case the second ALD metal gates 46A, 46B are not isolated from first metal gates 40A, 40B, thereby enabling the same gate potential to be applied to the bottom and top transistors.

At the process stage shown in FIG. 16, the fabrication of the top and bottom transistor stacks is complete except for any silicidation, though additional processing steps can be performed to form additional circuit elements, such as sidewall capacitors and/or non-volatile memory cells. As shown, the depicted transistor stack includes a bottom nanosheet transistor stack and a top nanosheet transistor stack. The depicted bottom nanosheet transistor stack includes a first nanosheet transistor which includes the first silicon channel region 13 under control of gate electrodes 40A, 40B having a first gate structure, and a second planar FET transistor including the first silicon channel region 11 under control of the gate electrode 40A. However, the second planar FET transistor could be replaced with a second nanosheet transistor by patterning and etching the silicon layer 11 to match the patterned silicon layer 13 and including an additional SiGe layer (not shown) below the first silicon channel region 11 which is processed with the same steps applied to the SiGe layer 12 described hereinabove to form a gate electrode for the bottom nanosheet transistor stack. In similar fashion, the depicted top nanosheet transistor stack includes a third nanosheet transistor which includes the silicon channel region 19 under control of gate electrodes 46A, 46B having a second, different gate structure, and a fourth planar FET transistor including the silicon channel region 17 and seed layer 16 under control of the gate electrode 46A. Again, the fourth planar FET transistor could be replaced with a nanosheet transistor by including an additional SiGe layer (not shown) below the silicon channel region 17 which is processed with the same steps applied to the SiGe layers described hereinabove to form a gate electrode for the top nanosheet transistor stack.

Figure 17:
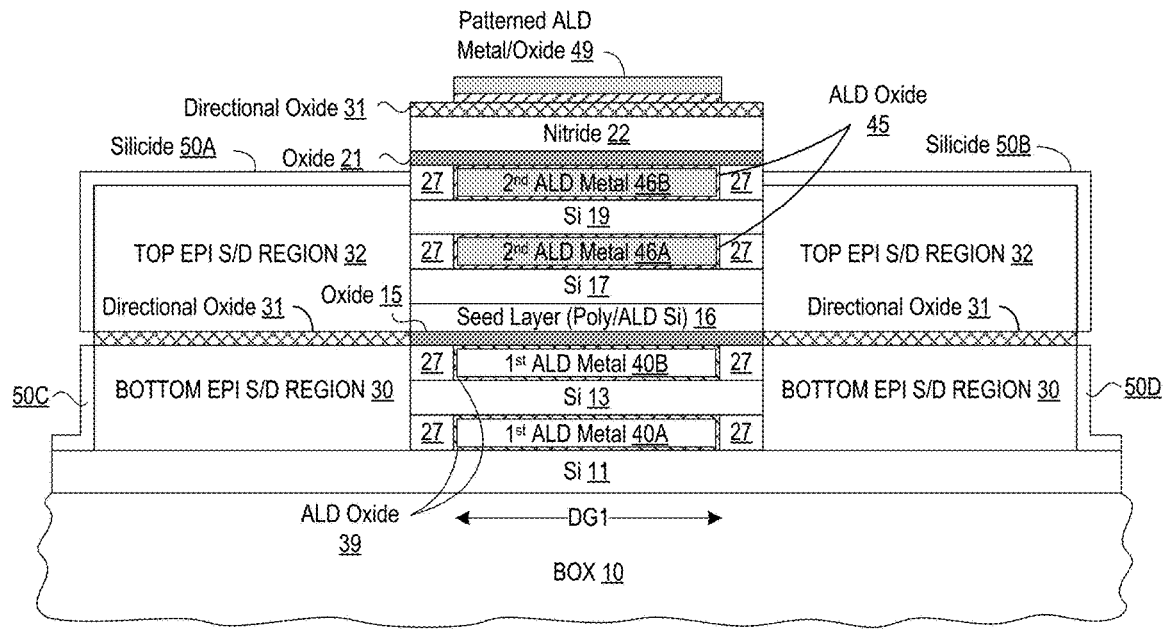
FIG. 17 illustrates processing subsequent to FIG. 16 after selectively forming silicide layers on the exposed epitaxial source/drain regions.

FIG. 17 illustrates processing of the semiconductor structure subsequent to FIG. 16 after selectively forming silicide layers 50A-D on the exposed bottom and top epitaxial source/drain regions 30, 32. As formed, the silicide layers 50A-B facilitate electrical connection to the top epitaxial source/drain regions 32, while the silicide layers 50C-D facilitate electrical connection to the bottom epitaxial source/drain regions 30. While any desired silicide formation process may be used to form the silicide layers 50A-D (such as $CoSi_2$ or NiSi), an example silicide formation sequence would be to deposit or sputter a conductive or metal layer (e.g., cobalt or nickel) over the semiconductor structure, followed by a heating step to react the metal layer with the source/drain regions 30, 32 to form silicide layers 50A-D. As depicted, there is no silicide formed on the exposed directional oxide 31, thereby forming a first gap between the silicide layers 50A, 50C and a second gap between the silicide layers 50B, 50D. In an illustrative embodiment, the reaction of the metal layer and the source/drain regions 30, 32 is promoted by performing an initial rapid thermal anneal step (e.g., 400-600° C.), followed by a Piranha clean step to remove excess metal, and then followed by a second rapid thermal anneal step (e.g., 650-850° C.). The time and temperature of the initial rapid thermal anneal step are selected so that the metal layer reacts with the exposed surfaces of the source/drain regions 30, 32. After the Piranha clean step, the time and temperature of the second rapid thermal anneal step are selected so that the reacted silicide 50A-D is pushed into a low resistivity phase.

Figure 18:
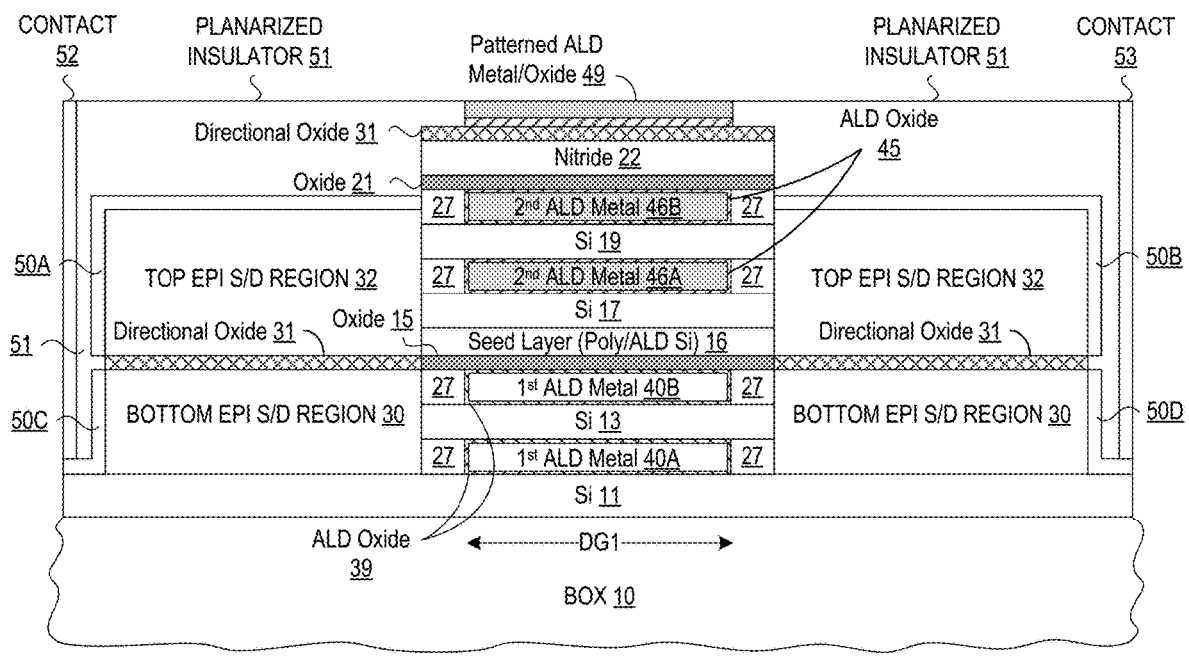
FIG. 18 illustrates processing subsequent to FIG. 17 after forming contacts to silicide layers for the bottom nanosheet transistor stack.

FIG. 18 illustrates processing of the semiconductor structure subsequent to FIG. 17 after forming contacts 52 to the silicide layers 50C-D for the bottom nanosheet transistor stack. While any suitable contact formation process may be used, an example sequence may include forming an insulating layer 51 on the sidewalls of the silicide layers 50A-D, such as by depositing an insulating oxide or nitride layer over the semiconductor structure which is then planarized (e.g., etched and/or polished) to substantially level with the top surface of patterned ALD metal/oxide 49. Subsequently, a patterned contact etch mask (not shown) may be formed over the planarized insulating layer 51 by depositing, patterning, etching or developing a photoresist or hard mask layer to define openings where one or more etch processes are applied to create the contact etch openings, such as by performing a sequence of reactive-ion etching (RIE) steps having suitable etch chemistry properties to remove exposed portions of the insulating layer 51 and to create the contact openings to the underlying silicide layers 50C, 50D. Subsequently, the contact openings may be filled with conductive material to make electrical contacts 52, 53 to contact the underlying silicide layers 50C, 50D, such as by depositing one or more conductive layers using CVD, PECVD, PVD, ALD, sputtering, or any combination(s) of the above to fill the contact openings in the insulating layer 51. In addition, a planarization process may be applied to remove excess conductive material, such as by using a chemical mechanical polish (CMP) process. At this point, additional interconnects and conductors are formed with any desired Middle End Of Line (MEOL) and Back End of Line (BEOL) processing steps.

As a result of the processing steps illustrated in FIGS. 1-18, there is provided a nanosheet transistor stack formed with a top nanosheet transistor and bottom nanosheet transistor having different gate electrode structures and/or materials and separated from one another by a barrier oxide layer 15, thereby providing a straightforward method for integrating stacked nanosheet transistors having different gate structures in the same stack. While specific implementation details are described herein for integrating the fabrication of nanosheet transistors with different gate structures to make dual use of fabrication steps, it will be appreciated that additional or fewer processing steps may be used and/or combined. And depending upon the electrical connection and doping types used for the source/drain regions 30, 32 and silicon channel regions 11, 13, 17, 19, as well as the ALD oxide and ALD metal gate materials used, the transistor stack may be configured with NMOS nanosheet transistors, PMOS nanosheet transistors, or a combination of NMOS and PMOS nanosheet transistors.

Figure 19:
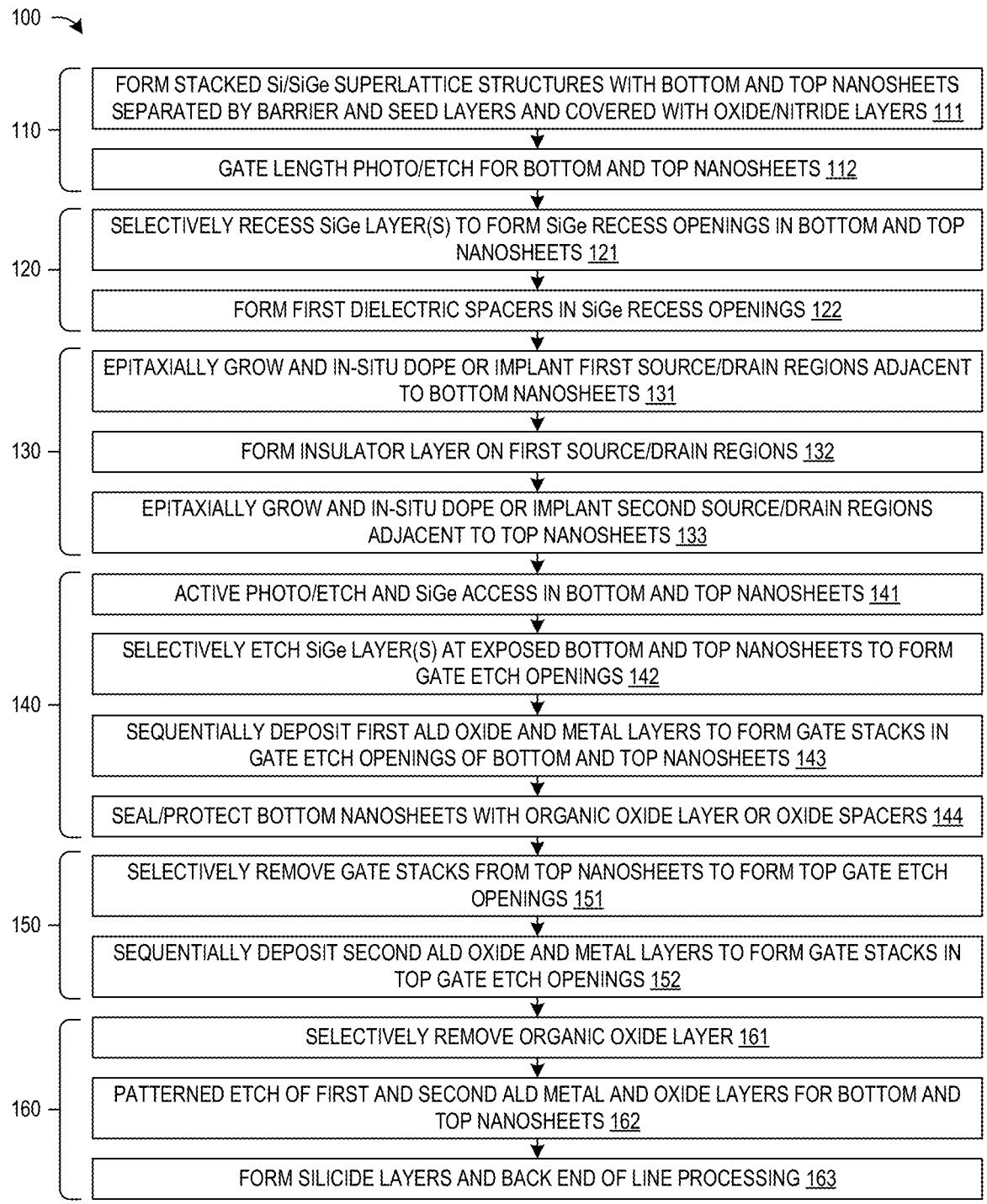
FIG. 19 illustrates a simplified process flow for fabricating stacked nanosheet transistors having different gate materials in accordance with selected embodiments of the present disclosure.

Turning now to FIG. 19, there is illustrated a simplified process flow 100 for fabricating stacked nanosheet transistors having different gate structures and/or materials in accordance with selected embodiments of the present disclosure. Stated generally, the process includes an initial set of fabrication steps 110 to fabricate a wafer substrate with a patterned transistor stack that includes bottom and top superlattice structures of alternating semiconductor layers (e.g., Si and SiGe) separated from one another by a barrier oxide layer. A second set of fabrication steps 120 processes the patterned transistor stack to form and protect remnant SiGe layers in the bottom and top transistor stacks using dielectric spacers in SiGe recess openings. A third set of fabrication steps 130 processes the patterned transistor stack to form bottom and top source/drain regions for the bottom and top transistor stacks that are separated from one another by an insulator layer. A fourth set of fabrication steps 140 processes the patterned transistor stack by using selective SiGe etch and ALD deposition of first gate dielectric and gate conductor layers to form first gate electrodes in the bottom and top transistor stacks. A fifth set of fabrication steps 150 processes the patterned transistor stack to replace the first gate electrodes in the top transistor stack with second gate electrodes by using ALD deposition of second, different gate dielectric and gate conductor layers to form second gate electrodes in the top transistor stack. A sixth set of fabrication steps 160 processes the patterned transistor stack to form bottom and top gate layers to contact the first and second gate electrodes in the bottom and top transistor stacks and to separately form silicide and contacts to the source/drain regions for the bottom and top nanosheet transistors. As will be appreciated, each set of fabrication steps 110, 120, 130, 140, 150, 160 can be implemented in different embodiments using the processing steps disclosed herein or modifications thereto as will be understood by those skilled in the art. However, by way of illustrating selected example embodiments of the present disclosure, each set of fabrication steps 110, 120, 130, 140, 150, 160 is described hereinbelow with an example processing step sequence.

Starting with the initial set of fabrication steps 110, the process 100 may begin at step 111 with a wafer substrate which is processed to form stacked silicon/silicon germanium superlattice structures on the wafer substrate. In selected embodiments, the stacked silicon/silicon germanium superlattice structures are formed with stacked bottom and top Si/SiGe nanosheets, where the bottom Si/SiGe nanosheets are formed by epitaxially growing alternating layers of Si and SiGe on a silicon-on-insulator (SOI) substrate layer, where a barrier layer (e.g., oxide) and seed layer (e.g., poly or ALD silicon) are formed on the bottom Si/SiGe nanosheets, where the top Si/SiGe nanosheets are formed by epitaxially growing alternating layers of Si and SiGe on the seed layer, and where the top Si/SiGe nanosheets are covered by depositing an oxide protective layer and/or a protective nitride layer.

The initial set of fabrication steps 110 may also include a gate length photo and etch step 112 where the stacked bottom and top Si/SiGe nanosheets are processed with a gate length photo/etch process to form a transistor stack. For example, a photoresist layer may be deposited, patterned, etched and developed to form a patterned photoresist or hard mask layer on the protective oxide or nitride layer. With the patterned photoresist/hard mask layer in place, the processing at step 112 may include applying one or more etch processes to create a transistor stack. The etch processing can include a sequence of reactive-ion etching (RIE) steps having suitable etch chemistry properties to sequentially remove exposed portions of the protective oxide or nitride and underlying layers of the stacked bottom and top Si/SiGe nanosheets.

To process the patterned transistor stack to form and protect remnant SiGe layers in the bottom and top nanosheets stacks, the disclosed second set of fabrication steps 120 may include a SiGe selective etch step 121 where SiGe layers at the exposed sides of the transistor stack are selectively etched or recessed to form SiGe recess openings in the bottom and top Si/SiGe nanosheets. For example, a controlled etch process, such as a timed isotropic dry etch, may be applied to selectively recess the SiGe layers exposed at the sides of the transistor stack, thereby forming SiGe recess openings in the bottom and top nanosheet stacks by partially recessing SiGe layers.

The second set of fabrication steps 120 may also include a dielectric spacer formation step 122 where the SiGe recess openings of the transistor stack are filled with one or more dielectric layers. For example, a first inner nitride layer may be deposited over the semiconductor structure, and then patterned and isotropically etched to leave the inner nitride layer only in the SiGe recess openings of the transistor stack.

To process the patterned transistor stack to separately form epitaxial source/drain regions for each of the stacked bottom and top transistor stacks, the disclosed third set of fabrication steps 130 may epitaxially grow and in-situ dope or implant first source/drain regions adjacent to the bottom nanosheet layers at step 131. For example, a first epitaxial silicon deposition or growth process may be used to form first epitaxial source/drain regions to surround the transistor stack up to the height of the bottom nanosheets, either by a controlled epitaxial growth process or an overgrowth process coupled with an epitaxial silicon etch step. Depending on the type of nanosheet transistor formed in the bottom nanosheets, the first epitaxial source/drain regions may be doped or implanted with N-type or P-type impurities. After forming the first epitaxial source/drain regions, an insulating layer is formed at step 132, such as by using PECVD TEOS to form a directional oxide on top of the first epitaxial source/drain regions. Subsequently, a second epitaxial silicon deposition or growth process may be used at step 133 to form second epitaxial source/drain regions over the insulation layer to surround the top nanosheets, either by a controlled epitaxial growth process or an overgrowth process coupled with epitaxial silicon etch and/or polish steps. Depending on the type of nanosheet transistor formed in the top nanosheets, the second epitaxial source/drain regions may be doped or implanted with N-type or P-type impurities. In addition, the formation of doped epitaxial source/drain regions may include one or more anneal processes to promote formation of crystalline structures in the epitaxial source/drain regions and/or may include one or more etch or polish steps to planarize the top surface of the epitaxial source/drain regions.

To process the patterned transistor stack to form gate stacks in the bottom and top nanosheet stacks, the disclosed fourth set of fabrication steps 140 may include an active photo and etch step 141 where the transistor stack is processed with an active photo/etch process to access the underlying SiGe layers in the transistor stack. For example, a photoresist layer may be deposited, patterned, etched and developed to form a patterned photoresist or hard mask layer with mask openings positioned over the transistor stack to access the underlying remnant SiGe layers in the bottom and top nanosheet stacks. With the patterned photoresist/hard mask layer in place, the photo/etch process may include applying one or more etch processes to access the underlying remnant SiGe layers in the transistor stack. The etch processing can include a sequence of reactive-ion etching (RIE) steps having suitable etch chemistry properties to sequentially remove exposed portions of the underlying layers, but without removing the accessed SiGe layers.

The fourth set of fabrication steps 140 may also include a SiGe selective etch step 142 for selectively etching the underlying remnant SiGe layers in the transistor stack. For example, a controlled etch process, such as a timed isotropic dry etch, may be applied to selectively etch and remove the remnant SiGe layers exposed at the transistor stack, thereby forming gate etch openings where the remnant SiGe layers were located in the transistor stack. In selected embodiments where the remnant SiGe layers in the bottom and top nanosheets have the same gate length dimension, the resulting gate etch openings formed by removing the remnant SiGe layers will have the same gate length dimension. However, in embodiments where the remnant SiGe layers in the bottom and top nanosheets have different gate length dimensions, the resulting gate etch openings formed by removing the remnant SiGe layers will have different gate length dimensions.

The fourth set of fabrication steps 140 may also include a gate stack or electrode formation step 143 for forming gate electrode stacks in the gate etch openings of the transistor stack by sequentially depositing a first gate dielectric layer and a first gate conductor layer. For example, the gate stacks or electrodes may be formed by depositing a first ALD oxide layer (e.g., hafnium oxide) to conformally form a first thin gate dielectric layer in the gate etch openings of the transistor stack, and then depositing a first ALD metal layer (e.g., titanium nitride) to form gate electrode stacks by filling the gate etch openings. The specific materials used to form the first gate dielectric layer and first gate conductor layer are selected to provide specified structural and/or performance characteristics for the bottom transistor stack.

The fourth set of fabrication steps 140 may also include a bottom nanosheet protection step 144 where an organic oxide layer is formed over the substrate structure to protect or seal the bottom nanosheet stack. For example, a layer of organic oxide may be deposited and spun on to flow into the low regions of the semiconductor structure. By controlling the deposition quantity, the deposited organic oxide fills up to the oxide barrier layer to cover the bottom nanosheet stack while leaving exposed the top nanosheet stack. Alternatively, oxide sidewall spacers could be formed at step 144 to protect the bottom nanosheets by depositing and anisotropically etching an oxide layer to form oxide sidewall spacers to protect the bottom nanosheets while the top nanosheets are subsequently processed. At this point in the fabrication process 100, the transistor stack includes a first gate electrode stack in the bottom nanosheet stack that is protected against the fifth set of fabrication steps 150 for defining the gate electrodes in the top nanosheet stack.

To form gate electrodes in the top nanosheet stack, the disclosed fifth set of fabrication steps 150 may include one or more etch processes that are applied to selectively remove the gate stacks from the top transistor stack to form top gate etch openings at step 151. For example, a first conductor etch process (e.g., wet metal etch) may be applied to selectively remove the first gate conductor layers from the first gate electrodes formed in the top nanosheet layers. In addition, a first dielectric etch process (e.g., wet oxide etch) may be applied to selectively remove the first gate dielectric layers from the first gate electrodes formed in the top nanosheet layers, thereby forming top gate etch openings.

The fifth set of fabrication steps 150 may also include a second gate stack or electrode formation step 152 for forming second gate electrode stacks in the top gate etch openings of the top transistor stack by sequentially depositing a second gate dielectric layer and a second gate conductor layer. For example, the second gate stacks or electrodes may be formed by depositing a second ALD oxide layer (e.g., zirconium oxide) to conformally form a second thin gate dielectric layer in the top gate etch openings of the transistor stack, and then depositing a second ALD metal layer (e.g., titanium aluminum) to form the second gate electrode stacks by filling the top gate etch openings. The specific materials used to form the second gate dielectric layer and second gate conductor layer are selected to provide specified structural and/or performance characteristics for the top transistor stack that are different from the bottom transistor stack.

To process the patterned transistor stack to separately form bottom and top gate layers to contact the first and second gate electrode stacks in the bottom and top nanosheet transistors, the disclosed sixth set of fabrication steps 160 may include a dielectric removal step 161 to selectively remove the organic oxide layer from the bottom transistor stack, where the oxide etch chemistry is selected to not etch the remaining layers of the bottom and top nanosheets.

The sixth set of fabrication steps 160 may also include one or more patterned etch steps 162 to pattern and etch the first and second ALD metal and oxide layers to form gate contact layers for the top and bottom nanosheet transistors. For example, a first patterned metal etch process may be applied to selectively remove the first ALD metal and oxide layers to form the bottom gate contact layers which electrically connect to gate electrodes in the bottom nanosheets, such as by forming a patterned mask over the semiconductor structure with defined openings where one or more etch processes are applied to create the bottom gate contact layers by etching the first ALD metal and oxide layers. In addition, a second metal etch process may be applied to selectively remove the second ALD metal and oxide layers to form the top gate contact layers which electrically connect to gate electrodes in the top nanosheets. As will be appreciated, a single photo etch step may be used to pattern and etch the first and second ALD metal and oxide layers, but different etches may be applied for the two different ALD metals and oxides.

At this process stage, the front end of line processing of the bottom and top nanosheet transistors in the transistor stack is complete except for any silicidation, though additional processing steps can be performed to form additional circuit elements, such as sidewall capacitors and/or non-volatile memory cells.

The sixth set of fabrication steps 160 may also use one or more steps 163 to form silicide layers along with any required back-end-of-line processing to form contacts. For example, the silicide formation sequence of step 163 may start with one or more initial silicide formation steps to form silicide layers on exposed source/drain regions to facilitate electrical connection thereto. The initial silicide formation steps may result in separate silicide layers being formed for the source/drain regions of the bottom nanosheet transistors and for the source/drain regions of the top nanosheet transistors. For example, separate silicide layers may be formed on exposed source/drain regions of the bottom and top nanosheet transistors by using any suitable silicidation process to form silicide It will be appreciated that additional processing steps will be used to complete the fabrication of the stacked top and bottom nanosheet transistors into functioning devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the gate electrodes may vary, depending on the process and/or design requirements.

By now it should be appreciated that there has been provided a method for forming a semiconductor device having stacked nanosheet transistors with different gate structures. In the disclosed method, a stack of alternating semiconductor layers is provided on a substrate, where the stack includes a plurality of first semiconductor layers interspersed in alternating fashion with a plurality of second semiconductor layers. In selected embodiments, the stack of alternating semiconductor layers is provided by epitaxially growing alternating first and second semiconductor layers on the substrate to form a bottom portion of the stack, forming the barrier insulator layer on the bottom portion of the stack, and epitaxially growing alternating first and second semiconductor layers on the barrier insulator layer to form a top portion of the stack. The disclosed fabrication method also selectively etches the stack of alternating semiconductor layers to form a transistor stack on the substrate. In addition, the disclosed fabrication method processes the transistor stack to form a first set of gate electrode structures having a first gate structure between a first subset of the plurality of first semiconductor layers and to form a second set of gate electrode structures having a second, different gate structure between a second subset of the plurality of first semiconductor layers where the second set of gate electrode structures is formed over the first set of gate electrode structures in the transistor stack. In selected embodiments, each of the plurality of first semiconductor layers is a silicon nanosheet layer, and each of the plurality of second semiconductor layers comprises a silicon germanium nanosheet layer. In other embodiments, the plurality of first semiconductor layers is formed with a first semiconductor material and the plurality of second semiconductor layers is formed with a second semiconductor material having a different isotropic etch rate from the first semiconductor material. In selected embodiments, the processing of the transistor stack to form the first set of gate electrode structures includes forming first remnant second semiconductor layers in at least a bottom portion of the transistor stack; selectively removing the first remnant second semiconductor layers to form first gate electrode openings in the transistor stack; and sequentially depositing a first gate dielectric layer and first conductive gate layer in the first gate electrode openings, thereby forming the first set of gate electrode structures which replace the first remnant second semiconductor layers in the transistor stack. In addition, the transistor stack may be processed to form the second set of gate electrode structures by sealing the bottom portion of the transistor stack with a dielectric layer, such as an organic oxide layer or spin-on glass; selectively removing the first gate dielectric layer and first conductive gate layer from a top portion of the transistor stack to form second gate electrode openings in the top portion of the transistor stack; and sequentially depositing a second gate dielectric layer and second conductive gate layer in the second gate electrode openings, thereby forming the second set of gate electrode structures in the top portion of the transistor stack. In other embodiments, the processing of the transistor stack may include forming the first set of gate electrode structures in a bottom portion of the transistor stack by conformally depositing a first gate dielectric layer using an atomic layer deposition process and by conformally depositing a first gate conductor layer using an atomic layer deposition process; and forming the second set of gate electrode structures in a top portion of the transistor stack by conformally depositing a second gate dielectric layer using an atomic layer deposition process and by conformally depositing a second gate conductor layer using an atomic layer deposition process. In selected embodiments, the first gate structure may include a first gate dielectric layer and a first conductive gate layer; and the second, different gate structure may include a second gate dielectric layer and a second conductive gate layer. In such embodiments, the first and second gate dielectric layers may be formed with different materials and/or the first and second gate conductive gate layers may be formed with different materials.

In another form, there is provided a method for fabricating a semiconductor device which integrates stacked nanosheet transistors with different gate materials or structures in the same stack in a single nanosheet process flow. In the disclosed fabrication method, a nanosheet stack is provided on a substrate to include a bottom superlattice structure and a top superlattice structure separated from one another by a barrier insulator layer, where each of the bottom and top superlattice structures includes alternating silicon and silicon germanium nanosheet layers. In selected embodiments, the nanosheet stack is provided by epitaxially growing alternating nanosheet layers of silicon and silicon germanium on the substrate to form the bottom superlattice structure, forming the barrier insulator layer on the bottom superlattice structure, forming an epitaxial growth seed layer on the barrier insulator layer, and epitaxially growing alternating nanosheet layers of silicon and silicon germanium on the seed layer to form the top superlattice structure. The disclosed fabrication method also selectively etches the nanosheet stack of alternating silicon and silicon germanium layers to form a nanosheet transistor stack on the substrate. In addition, the disclosed fabrication method processes the nanosheet transistor stack to form first remnant silicon germanium nanosheet layers in the bottom and top superlattice structures. The disclosed fabrication method also forms first and second epitaxial source/drain semiconductor regions adjacent, respectively, to the bottom and top superlattice structures, where the first and second epitaxial source/drain semiconductor regions are electrically isolated from one another by an insulating layer. In addition, the disclosed fabrication method selectively processes the nanosheet transistor stack to form bottom gate electrodes having a first gate structure which replace the first remnant silicon germanium nanosheet layers in the bottom superlattice structure, thereby forming a bottom nanosheet transistor comprising the bottom gate electrodes, the silicon nanosheet layers from the bottom superlattice structure, and the first epitaxial source/drain semiconductor regions. In selected embodiments, the bottom gate electrodes having a first gate structure are formed by selectively removing the first remnant silicon germanium nanosheet layers from nanosheet transistor stack to form first gate electrode openings in the transistor stack, and then sequentially depositing a first gate dielectric layer and first conductive gate layer in the first gate electrode openings to form bottom gate electrodes having the first gate structure. In selected embodiments of the first gate structure, the first gate dielectric layer may be formed with hafnium oxide, and first conductive gate layer may be formed with titanium nitride. After forming the bottom gate electrodes, the disclosed fabrication method forms a protective structure, such as an organic oxide layer or sidewall spacers, to protect the bottom superlattice structure from subsequent processing. After forming the protective structure, the disclosed fabrication method selectively processes the nanosheet transistor stack to form top gate electrodes having a second, different gate structure which replaces the second remnant silicon germanium nanosheet layers in the top superlattice structure, thereby forming a top nanosheet transistor comprising the top gate electrodes, the silicon nanosheet layers from the top superlattice structure, and the second epitaxial source/drain semiconductor regions. In selected embodiments, the top gate electrodes having a second, different gate structure are formed by selectively forming second first gate electrode openings in the top superlattice structure of the transistor stack, and then sequentially depositing a second gate dielectric layer and second conductive gate layer in the second gate electrode openings to form top gate electrodes having the second, different gate structure. In selected embodiments of the second gate structure, the second gate dielectric layer may be formed with zirconium oxide, and second conductive gate layer may be formed with titanium aluminum.

In yet another form, there is provided a semiconductor device and associated method of fabrication. As disclosed, the semiconductor device includes a substrate, a first transistor stack formed on top of the substrate, and a second transistor stack formed on top of the first transistor stack. As formed, the first transistor stack includes a first transistor channel region with at least first and second semiconductor layers separated from one another in a vertical dimension extending from the substrate, and a first control electrode formed with a first gate dielectric layer and first gate conductor layer at least partially surrounding the first and second semiconductor layers to control current flow through the first transistor channel region. In addition, the second transistor stack includes a second transistor channel region formed with at least third and fourth semiconductor layers separated from one another in a vertical dimension extending from the substrate, and a second control electrode formed with a second gate dielectric layer and second gate conductor layer at least partially surrounding the third and fourth semiconductor layers to control current flow through the second transistor channel region. In selected embodiments, each of the first, second, third, and fourth semiconductor layers is formed with a silicon nanosheet layer. In selected embodiments, the first and second semiconductor layers are doped with a first doping type impurity, and the third and fourth semiconductor layers are doped with a second, opposite doping type impurity. In other embodiments, the first, second, third, and fourth semiconductor layers are doped with the same doping type impurity. In selected embodiments, the semiconductor device includes first epitaxial source/drain semiconductor regions adjacent to the first transistor stack and directly connected to the first transistor channel region. The semiconductor device may also include second epitaxial source/drain semiconductor regions adjacent to the second transistor stack and directly connected to the second transistor channel region. As formed, the first and second epitaxial source/drain semiconductor regions are electrically isolated from one another by an insulating layer. In selected embodiments, the first gate dielectric layer is a first ALD oxide layer (e.g., hafnium oxide) and the second gate dielectric layer is a second ALD oxide layer (e.g., zirconium oxide) that is formed with a different material from the first ALD oxide layer. In other selected embodiments, the first gate conductor layer is a first ALD metal layer (e.g., titanium nitride) and the second gate conductor layer is a second ALD metal layer (e.g., titanium aluminum) that is formed with a different material from the first ALD metal layer. In selected embodiments, the first gate dielectric layer has a different thickness from the second gate dielectric layer.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted stacked nanosheet transistor structures may be formed with different processing steps that can be combined and integrated, and can utilize Si/SiGe superlattice structures having different numbers of SiGe and Si layers. Also, the various constituent layers may be formed with different conductive materials than those disclosed. For example, the disclosure refers to the stacked superlattice structures being formed with alternating layers of silicon and silicon germanium, but it will be appreciated that stacked superlattice structure can be formed with any first and second semiconductor layers which have differential etch properties. In addition, the epitaxial sources and drains may be p-type or n-type, depending on whether forming either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
    providing a stack of alternating semiconductor layers on a substrate, the stack comprising a plurality of first semiconductor layers interspersed in alternating fashion with a plurality of second semiconductor layers;
    selectively etching the stack of alternating semiconductor layers to form a transistor stack on the substrate; and
    processing the transistor stack to form a first set of gate electrode structures having a first gate structure between a first subset of the plurality of first semiconductor layers and to form a second set of gate electrode structures having a second, different gate structure between a second subset of the plurality of first semiconductor layers, where the second set of gate electrode structures is formed over the first set of gate electrode structures in the transistor stack;
    where processing the transistor stack to form the first set of gate electrode structures comprises:
        processing the transistor stack to form first remnant second semiconductor layers in at least a bottom portion of the transistor stack;
        selectively removing the first remnant second semiconductor layers from the transistor stack, thereby forming first gate electrode openings in the transistor stack; and
        sequentially depositing a first gate dielectric layer and first conductive gate layer in the first gate electrode openings, thereby forming the first set of gate electrode structures which replace the first remnant second semiconductor layers in the transistor stack; and
    where processing the transistor stack to form the second set of gate electrode structures comprises:
        sealing the bottom portion of the transistor stack with a dielectric layer;
        selectively removing the first gate dielectric layer and first conductive gate layer from a top portion of the transistor stack, thereby forming second gate electrode openings in the top portion of the transistor stack; and
        sequentially depositing a second gate dielectric layer and second conductive gate layer in the second gate electrode openings, thereby forming the second set of gate electrode structures in the top portion of the transistor stack.

2. The method of claim 1, where each of the plurality of first semiconductor layers comprises a silicon nanosheet layer, and where each of the plurality of second semiconductor layers comprises a silicon germanium nanosheet layer.

3. The method of claim 1, where the plurality of first semiconductor layers is formed with a first semiconductor material and where the plurality of second semiconductor layers is formed with a second semiconductor material having a different isotropic etch rate from the first semiconductor material.

4. The method of claim 1, where sequentially depositing the first gate dielectric layer and first conductive gate layer in the first gate electrode openings comprises conformally depositing a first gate dielectric layer using an atomic layer deposition process and by conformally depositing a first gate conductor layer using an atomic layer deposition process; and
where sequentially depositing the second gate dielectric layer and second conductive gate layer in the second gate electrode openings comprises conformally depositing a second gate dielectric layer using an atomic layer deposition process and by conformally depositing a second gate conductor layer using an atomic layer deposition process.

5. The method of claim 1, where providing the stack of alternating semiconductor layers on a substrate comprises:
epitaxially growing alternating first and second semiconductor layers on the substrate to form a bottom portion of the stack;
forming a barrier insulator layer on the bottom portion of the stack; and
epitaxially growing alternating first and second semiconductor layers on the barrier insulator layer to form a top portion of the stack.

6. The method of claim 1, where the first gate structure comprises a first gate dielectric layer and a first conductive gate layer; where the second, different gate structure comprises a second gate dielectric layer and a second conductive gate layer; and where the first and second gate dielectric layers are formed with different materials.

7. The method of claim 1, where the first gate structure of the first set comprises a first gate dielectric layer and a first conductive gate layer; where the second, different gate structure comprises a second gate dielectric layer and a second conductive gate layer; and where the first and second gate conductive gate layers are formed with different materials.

8. The method of claim 1, where the first gate structure of the first set comprises a first gate dielectric layer and a first conductive gate layer; where the second, different gate structure comprises a second gate dielectric layer and a second conductive gate layer; where the first and second gate dielectric layers are formed with different materials and where the first and second gate conductive gate layers are formed with different materials.

9. A method for forming a semiconductor device comprising:
providing a nanosheet stack on a substrate comprising a bottom superlattice structure and a top superlattice structure separated from one another by a barrier insulator layer, where each of the bottom and top superlattice structures comprises alternating silicon and silicon germanium nanosheet layers;
selectively etching the nanosheet stack to form a nanosheet transistor stack on the substrate;
processing the nanosheet transistor stack to form first remnant silicon germanium nanosheet layers in the bottom and top superlattice structures;
forming first and second epitaxial source/drain semiconductor regions adjacent, respectively, to the bottom and top superlattice structures, where the first and second epitaxial source/drain semiconductor regions are electrically isolated from one another by an insulating layer;
selectively processing the nanosheet transistor stack to form gate electrodes having a first gate structure comprising a first gate dielectric layer and first conductive gate layer which replace the first remnant silicon germanium nanosheet layers in the bottom and top superlattice structures, thereby forming a bottom nanosheet transistor comprising the gate electrodes having the first gate structure, the silicon nanosheet layers from the bottom superlattice structure, and the first epitaxial source/drain semiconductor regions;
forming a protective structure to protect the bottom nanosheet transistor from subsequent processing; and
selectively processing the nanosheet transistor stack to form top gate electrodes having a second, different gate structure comprising a second gate dielectric layer and second conductive gate layer which replaces the first gate dielectric layer and first conductive gate layer in the top superlattice structure, thereby forming a top nanosheet transistor comprising the top gate electrodes, the silicon nanosheet layers from the top superlattice structure, and the second epitaxial source/drain semiconductor regions.

10. The method of claim 9, where the first gate dielectric layer comprises hafnium oxide, and where the first conductive gate layer comprises titanium nitride.

11. The method of claim 9, where the second gate dielectric layer comprises zirconium oxide, and where the second conductive gate layer comprises titanium aluminum.

* * * * *